(12) United States Patent
Green et al.

(10) Patent No.: US 6,888,856 B2
(45) Date of Patent: May 3, 2005

(54) METHOD AND APPARATUS FOR FILTERING AN OPTICAL BEAM

(75) Inventors: Evan D. H. Green, San Jose, CA (US); William B. Chapman, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 55 days.

(21) Appl. No.: 10/087,728

(22) Filed: Feb. 28, 2002

(65) Prior Publication Data

US 2002/0126345 A1 Sep. 12, 2002

Related U.S. Application Data

(63) Continuation of application No. 09/626,526, filed on Jul. 27, 2000.
(60) Provisional application No. 60/145,831, filed on Jul. 27, 1999.

(51) Int. Cl.[7] .................................................. H01S 3/98
(52) U.S. Cl. ......................... 372/20; 372/99; 372/102; 372/105
(58) Field of Search ........................... 372/20, 99, 102, 372/105

(56) References Cited

U.S. PATENT DOCUMENTS

| 3,788,743 A | 1/1974 | George |
| 3,899,748 A | 8/1975 | Bodlaj |

(Continued)

FOREIGN PATENT DOCUMENTS

| EP | 0924628 | | 8/1998 |
| WO | WO 98/05105 | * | 2/1998 |
| WO | WO 98/44424 | | 10/1998 |
| WO | WO 00/49689 | * | 8/2000 |
| WO | WO 01/04999 A1 | * | 1/2001 |
| WO | PCT/US02/07672 | * | 8/2002 |
| WO | WO 02/078137 A1 | * | 10/2002 |
| WO | WO 03/005500 A2 | * | 1/2003 |
| WO | WO 03/005501 A2 | * | 1/2003 |
| WO | WO 03/005512 A2 | * | 1/2003 |
| WO | PCT/US02/07672 | * | 3/2003 |

OTHER PUBLICATIONS

Ketelsen, L. J. P., "Simple Technique for Measuring Cavity Loss in Semiconductor Lasers," *Electronics Letters*, (Aug. 18, 1994), vol. 30, No. 17, pp. 1422–1424.*

(Continued)

(Continued)

Primary Examiner—Don Wong
Assistant Examiner—Cornelius H Jackson
(74) Attorney, Agent, or Firm—Blakely, Sokoloff, Taylor & Zafman LLP

(57) ABSTRACT

The invention pertains to wavelength-agile optical filters suitable for wavelength-division-multiplexed (WDM) optical communications networks. More particularly, the invention pertains to optical filters with a wavelength reference that can be remotely switched to arbitrarily selectable channels on a standard grid, and to re-configurable optical communications networks employing same. The present invention provides a communication apparatus with a tunable filter which may be used in a wide range of applications including tuning an external cavity laser (ECL), selecting a wavelength for an add/drop multiplexer and providing channel selection and feedback for a wavelength locker. The filter may be utilized as a discrete component or in combination with circulators, wavelength lockers and gain medium. The filter may be implemented in whole or in part as part of a gain medium. The tunable filter exhibits a compact form factor and precise tuning to any selected wavelength of a predetermined set of wavelengths comprising a wavelength grid. The tunable filter may thus be utilized in telecom applications to generate the center wavelengths for any channel on the ITU or other optical grid.

32 Claims, 9 Drawing Sheets

U.S. PATENT DOCUMENTS

| | | |
|---|---|---|
| 3,921,099 A | 11/1975 | Abrams et al. |
| 3,965,440 A | 6/1976 | Graves |
| 3,967,211 A | 6/1976 | Itzkan et al. |
| 4,309,671 A | 1/1982 | Malyon |
| 4,410,992 A | 10/1983 | Javan |
| 4,460,977 A | 7/1984 | Shimada et al. |
| 4,504,950 A | 3/1985 | AuYeung |
| 4,560,246 A | 12/1985 | Cotter |
| 4,583,227 A | 4/1986 | Kirkby |
| 4,730,105 A | 3/1988 | Mitschke et al. |
| 4,770,047 A | 9/1988 | Arditty et al. |
| 4,839,614 A | 6/1989 | Hill et al. |
| 4,843,233 A | 6/1989 | Jeunhomme |
| 4,847,854 A | 7/1989 | Van Dijk |
| 4,870,269 A | 9/1989 | Jeunhomme et al. |
| 4,932,782 A | 6/1990 | Graindorge et al. |
| 4,934,816 A | 6/1990 | Silver et al. |
| 4,947,398 A * | 8/1990 | Yasuda et al. ......... 372/29.021 |
| 4,994,677 A | 2/1991 | Graindorge |
| 5,022,745 A | 6/1991 | Zayhowski et al. |
| 5,028,395 A | 7/1991 | Sebille et al. |
| 5,050,179 A | 9/1991 | Mooradian |
| 5,058,124 A | 10/1991 | Cameron et al. |
| 5,103,457 A | 4/1992 | Wallace et al. |
| 5,115,677 A | 5/1992 | Martin et al. |
| 5,124,993 A | 6/1992 | Braunlich et al. |
| 5,130,998 A | 7/1992 | Wakata et al. |
| 5,141,316 A | 8/1992 | Lefevre et al. |
| 5,163,063 A | 11/1992 | Yoshikawa et al. |
| 5,172,185 A | 12/1992 | Leuchs et al. |
| 5,181,078 A | 1/1993 | Lefevre et al. |
| 5,181,214 A | 1/1993 | Berger et al. |
| 5,185,643 A | 2/1993 | Vry et al. |
| 5,214,659 A | 5/1993 | Terada et al. |
| 5,218,610 A | 6/1993 | Dixon |
| 5,225,930 A | 7/1993 | Land et al. |
| 5,245,626 A | 9/1993 | Burke et al. |
| 5,251,222 A | 10/1993 | Hester et al. |
| 5,263,037 A | 11/1993 | Trutna, Jr. et al. |
| 5,270,791 A | 12/1993 | Lefevre et al. |
| 5,289,491 A | 2/1994 | Dixon |
| 5,305,330 A | 4/1994 | Rieder et al. |
| 5,319,668 A | 6/1994 | Luecke |
| 5,321,717 A | 6/1994 | Adachi et al. |
| 5,327,447 A | 7/1994 | Mooradian |
| 5,331,651 A | 7/1994 | Becker et al. |
| 5,347,527 A | 9/1994 | Favre et al. |
| 5,349,439 A | 9/1994 | Graindorge et al. |
| 5,349,440 A | 9/1994 | DeGroot |
| 5,373,515 A | 12/1994 | Wakabayashi et al. |
| 5,387,974 A | 2/1995 | Nakatani |
| 5,412,474 A | 5/1995 | Reasenberg et al. |
| 5,412,676 A | 5/1995 | Schnier et al. |
| 5,414,280 A | 5/1995 | Girmay |
| 5,418,800 A | 5/1995 | Prior et al. |
| 5,420,687 A | 5/1995 | Kachanov |
| 5,428,700 A | 6/1995 | Hall |
| 5,438,579 A | 8/1995 | Eda et al. |
| 5,444,724 A | 8/1995 | Goto |
| 5,450,202 A | 9/1995 | Tisue |
| 5,473,625 A | 12/1995 | Hansen et al. |
| 5,543,916 A | 8/1996 | Kachanov |
| 5,583,638 A | 12/1996 | Cutler |
| 5,594,744 A | 1/1997 | Lefevre et al. |
| 5,606,439 A | 2/1997 | Wu |
| 5,631,736 A | 5/1997 | Thiel et al. |
| 5,651,018 A | 7/1997 | Mehuys et al. |
| 5,673,129 A | 9/1997 | Mizrahi |
| 5,712,704 A | 1/1998 | Martin et al. |
| 5,719,674 A | 2/1998 | Martin et al. |
| 5,737,109 A | 4/1998 | Goodwin |
| 5,751,750 A | 5/1998 | Friede et al. |
| 5,760,391 A | 6/1998 | Narendran |
| 5,777,773 A | 7/1998 | Epworth et al. |
| 5,802,085 A | 9/1998 | Lefevre et al. |
| 5,812,716 A | 9/1998 | Ohishi |
| 5,825,792 A | 10/1998 | Villeneuve et al. |
| 5,848,092 A | 12/1998 | Mitsumoto et al. |
| 5,862,162 A | 1/1999 | Maeda |
| 5,872,881 A | 2/1999 | Rossi et al. |
| 5,886,785 A | 3/1999 | Lefevre et al. |
| 5,917,188 A | 6/1999 | Atkinson et al. |
| 5,943,352 A | 8/1999 | Fee |
| 5,946,331 A | 8/1999 | Amersfoort et al. |
| 5,991,061 A | 11/1999 | Adams et al. |
| 6,018,535 A | 1/2000 | Maeda |
| 6,018,536 A | 1/2000 | Alphonse |
| 6,026,100 A | 2/2000 | Maeda |
| 6,034,799 A | 3/2000 | Hansen |
| 6,040,950 A | 3/2000 | Broome |
| 6,043,883 A | 3/2000 | Leckel et al. |
| 6,044,095 A | 3/2000 | Asano et al. |
| 6,061,369 A | 5/2000 | Conradi |
| 6,064,501 A | 5/2000 | Roberts et al. |
| 6,081,539 A | 6/2000 | Mattori et al. |
| 6,084,695 A | 7/2000 | Martin et al. |
| 6,108,355 A | 8/2000 | Zorabedian |
| 6,115,121 A | 9/2000 | Erskine |
| 6,115,401 A | 9/2000 | Scobey et al. |
| 6,141,370 A * | 10/2000 | Avrutsky et al. ............ 372/102 |
| 6,151,337 A | 11/2000 | Carlsten et al. |
| 6,181,717 B1 | 1/2001 | Kner et al. |
| RE37,044 E | 2/2001 | Wu |
| 6,192,058 B1 | 2/2001 | Abeles |
| 6,201,638 B1 | 3/2001 | Hall et al. |
| 6,205,159 B1 | 3/2001 | Sesko et al. |
| 6,215,802 B1 | 4/2001 | Lunt |
| 6,229,835 B1 | 5/2001 | Tomaru et al. |
| 6,243,517 B1 | 6/2001 | Deacon |
| 6,246,480 B1 | 6/2001 | O'Brien |
| 6,249,364 B1 | 6/2001 | Martin et al. |
| 6,249,365 B1 | 6/2001 | Mizrahi et al. |
| 6,252,718 B1 | 6/2001 | Lefevre |
| 6,259,712 B1 | 7/2001 | DeCain et al. |
| 6,263,004 B1 | 7/2001 | Arvidsson et al. |
| 6,282,215 B1 * | 8/2001 | Zorabedian et al. .......... 372/20 |
| 6,301,274 B1 | 10/2001 | Tayebati et al. |
| 6,301,280 B1 | 10/2001 | Broutin et al. |
| 6,304,586 B1 | 10/2001 | Pease et al. |
| 6,314,115 B1 | 11/2001 | Delfyett et al. |
| 6,321,011 B2 | 11/2001 | Deacon |
| 6,324,204 B1 | 11/2001 | Deacon |
| 6,330,253 B1 | 12/2001 | Tuganov et al. |
| 6,331,892 B1 | 12/2001 | Green |
| 6,337,660 B1 | 1/2002 | Esman et al. |
| 6,366,592 B1 | 4/2002 | Flanders |
| 6,366,689 B1 | 4/2002 | Rao et al. |
| 6,404,538 B1 | 6/2002 | Chen et al. |
| 6,441,933 B1 | 8/2002 | Jang |
| 6,463,085 B1 | 10/2002 | Tayebati |
| 6,470,036 B1 | 10/2002 | Bailey et al. |
| 6,526,071 B1 | 2/2003 | Zorabedian et al. |
| 6,532,091 B1 | 3/2003 | Miyazaki et al. |
| 6,600,760 B1 | 7/2003 | Green et al. |
| 2002/0048297 A1 | 4/2002 | Irie et al. |
| 2002/0054614 A1 | 5/2002 | Jin |
| 2002/0126345 A1 | 9/2002 | Green et al. |
| 2002/0136104 A1 | 9/2002 | Daiber |

OTHER PUBLICATIONS

Shtengel, G. E., et al., "Internal Optical Loss Measurements in 1.3μm InGaAsP Lasers," *Electronic Letters*, (Jul. 6, 1995), vol. 31, No. 14, pp. 1157–1159.*

Boggs. B. et al., "Simple High–Coherence Rapidly Tunable External–Cavity Diode Laser," Optics Letters, (Dec. 15, 1998), vol. 23, No. 24, pp. 1906–1908.*

Favre, et al. "External–Cavity Semiconductor Laser With 15 nm Continuous Tuning Range", Electronics Letters, Jun. 19, 1996.

Macleod, H.A. *Thin Film Optical Filters* $2^{nd}$ Edition, McGraw–Hill, 1989, pp. 244–269.

Mellis et al. "Miniature Packaged External–Cavity Semiconductor Laser With 50 Ghz Continuous Electrical Tuning Range" Electronics Letters, Apr. 22, 1988.

Rosenberg, K.P. et al. "Logarithmically Variable Infrared Etalon Filters," SPIE, vol. 2262/223, pp. 223–232.

Scobey & Stupik, Stable Ultra–Narrow Bandpass Filters, SPIE, vol. 2262, pp. 37–46.

Siegman A.E. "An Introduction to Lasers and Masers," Mc–Graw–Hill, Inc. 1971.

Takashashi, H. "Temperture Stability of Thin–Film Narrow–Bandpass Filters Produced by Ion–Assisted Deposition" Applied Optics, vol. 34, No. 4, Feb. 1, 1995.

Yoder, *Optical Instrument Structural Design*, pp. 612–619.

Zhang, X.X., "An Interference Filter Based External Cavity Laser For Dense Wavelength Division Multiplexing Applications" Coring OCA Corp. pp. 103–108.

* cited by examiner

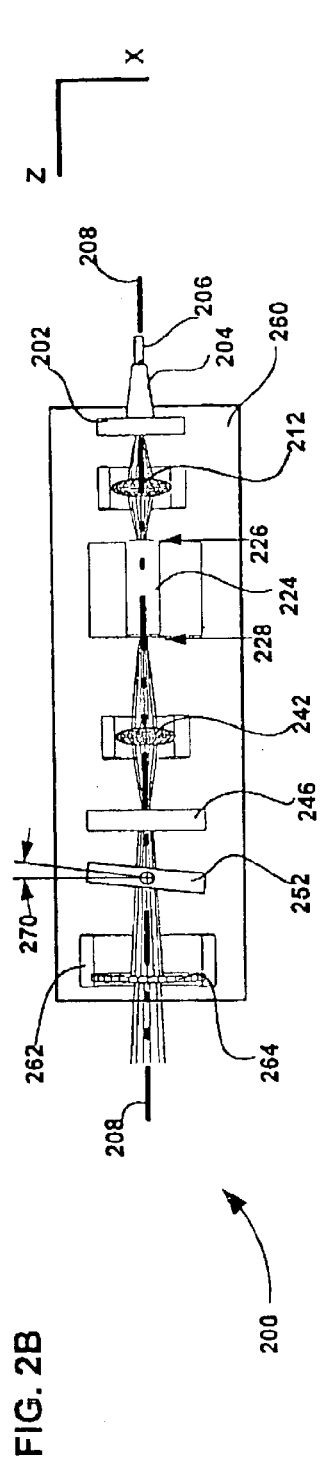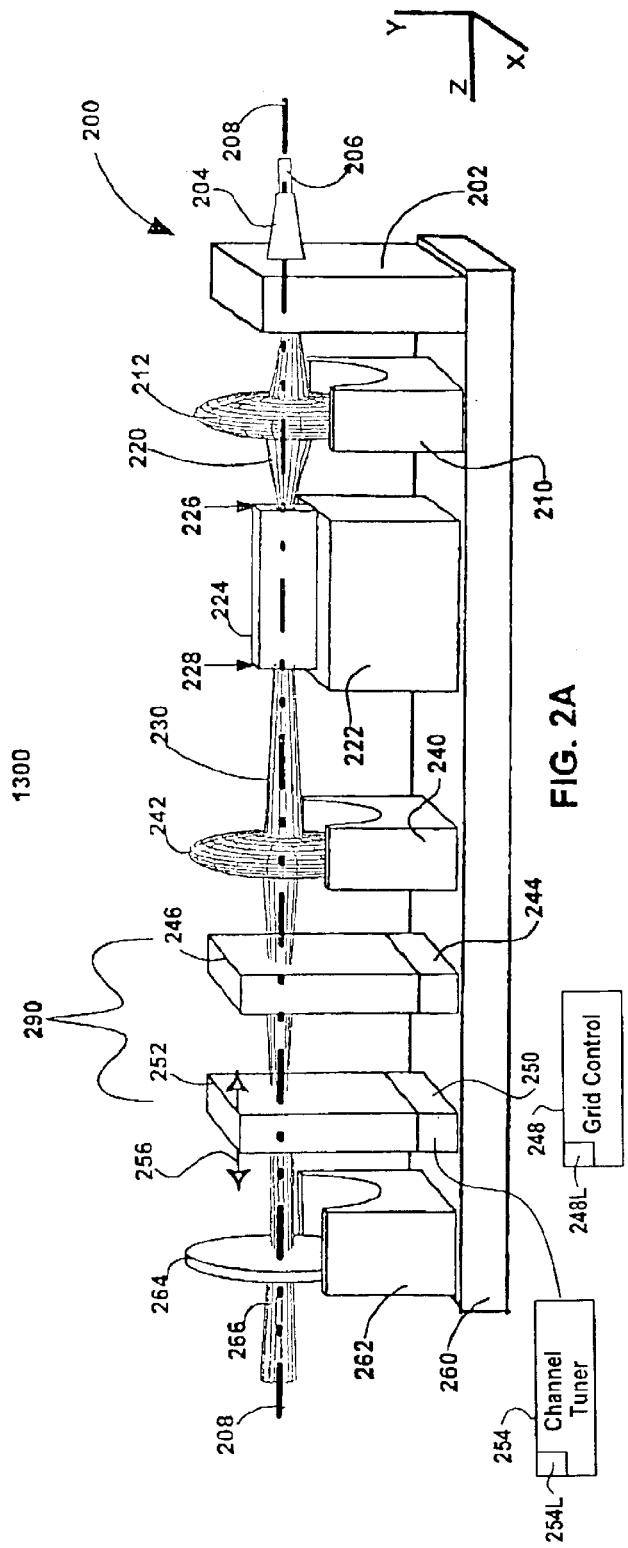

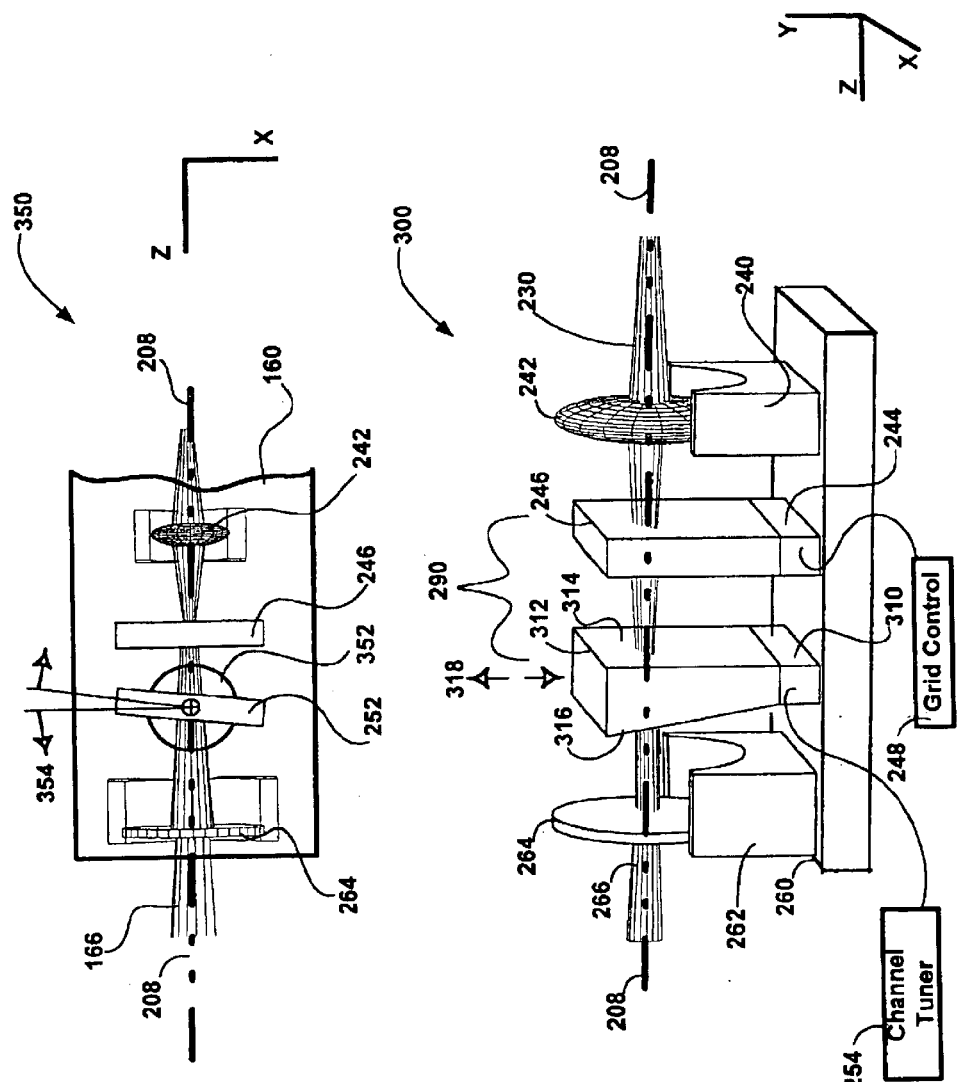

METHOD AND APPARATUS FOR FILTERING AN OPTICAL BEAM

CROSS REFERENCE TO RELATED APPLICATIONS

The application is continuation of U.S. application Ser. No. 09/626,526 filed Jul. 27, 2000, pending, which claims benefit of U.S. Provisional Application No. 60/145,831 filed on Jul. 27, 1999, all of which are hereby incorporated by reference thereto, in their entireties, and to which this application claims priority under 35 U.S.C. Section 120.

BACKGROUND OF THE INVENTION

1. Field of Invention

The invention pertains to wavelength-agile optical filters suitable for wavelength-division-multiplexed (WDM) optical communications networks. More particularly, the invention pertains to optical filters with a wavelength reference that can be remotely switched to arbitrarily selectable channels on a standard grid, and to re-configurable optical communications networks employing same.

2. Description of the Related Art

The telecommunications network serving the United States and the rest of the world is presently evolving from analog to digital transmission with ever increasing bandwidth requirements. Fiber optic cable has proved to be a valuable tool, replacing copper cable in nearly every application from large trunks to subscriber distribution plants. Fiber optic cable is capable of carrying much more information than copper with lower attenuation.

The T-1 standards committee ANSI has provided a draft document, "ANSI T1.105-1988", dated Mar. 10, 1988, which sets forth specifications for rate and format of signals which are to be used in optical interfaces. The provided specifications detail the Synchronous Optical Network (SONET) standard. SONET defines a hierarchy of multiplexing levels and standard protocols which allow efficient use of the wide bandwidth of fiber optic cable, while providing a means to merge lower level time division multiplexed public switched telephone network (PSTN) signals into a common medium. In essence, SONET established a uniform standardization transmission and signaling scheme, which provided a synchronous transmission format that is compatible with all current and anticipated signal hierarchies. Because of the nature of fiber optics, expansion of bandwidth is easily accomplished.

Currently this expansion of bandwidth is being accomplished by what is known as "wavelength division multiplexing" (WDM), in which separate subscriber/data sessions may be handled concurrently on a single optic fiber by means of modulation of each of those subscriber datastreams on different portions of the light spectrum. Therefore, WDM is the optical equivalent of frequency division multiplexing (FDM). Current International Telecommunications Union (ITU) specifications call for channel separations of approximately 0.4 mm, i.e., 50 GigaHertz. At this separation, as many as 128 channels may be carried by a single fiber in a bandwidth range within the same capacity of an erbium doped fiber amplifier (EDFA).

Across an optical network a broad range of optical components, e.g. transmitters, receivers, multiplexers, demultiplexers, isolators, amplifiers, isolators, etc. must be fabricated to handle each of these channels. Typically each component is fabricated for a specific channel.

For optical transmitters, for example, each subscriber datastream is optically modulated onto the output beam of a corresponding semiconductor laser. The modulated information from each of the semiconductor lasers is combined onto a single optic fiber for transmission. The lasers presently deployed are distributed-feedback (DFB) diode lasers. The wavelength grid is defined by the transmission peaks of a Fabry-Perot reference etalon. The technology for fabricating these etalons from glass or fused silica in large quantities at reasonable cost is well developed. Present transmitters use a combination of a DFB laser and a reference etalon in a feedback control loop. DFB lasers suffer from the drawback that they have small tuning ranges of ~3 nm (See, e.g., J. Carroll, J. Whiteaway, & D. Plumb, *Distributed feedback semiconductor lasers,* SPIE Press, 1998). A DFB laser's characteristics can only be approximately determined by design. In practice the center wavelengths are distributed across the grid span due to statistical variations in the manufacturing process. Thus each DFB laser transmitter must be individually sorted and is usable for only one channel or a small number of adjacent channels. As a result, DFB laser transmitters cannot be assigned to arbitrary channels.

On the other hand, WDM networks are evolving towards re-configurable architectures in which each transmitter's wavelength must be re-selectable by remote command. Re-configurable networks offer significant capacity, reliability, and management advantages over static systems (See, e.g., R. Ramaswami and K. Sivarajan, *Optical Networks, A Practical Perspective,* Morgan Kaufmann Publishers, 1998).

Thus there exists a need for optical components including transmitters that can be arbitrarily switched to desired channel wavelengths within the wavelength grid of a WDM network.

SUMMARY OF THE INVENTION

The invention pertains to wavelength-agile optical filters suitable for wavelength-division-multiplexed (WDM) optical communications networks. More particularly, the invention pertains to optical filters with a wavelength reference that can be remotely switched to arbitrarily selectable channels on a standard grid, and to re-configurable optical communications networks employing same. The present invention provides a communication apparatus with a tunable filter which may be used in a wide range of applications including tuning an external cavity laser (ECL), selecting a wavelength for an add/drop multiplexer and providing channel selection and feedback for a wavelength locker. The filter may be utilized as a discrete component or in combination with circulators, wavelength lockers and gain medium. The filter may be implemented in whole or in part as part of a gain medium. The tunable filter exhibits a compact form factor and precise tuning to any selected wavelength of a predetermined set of wavelengths comprising a wavelength grid. The tunable filter may thus be utilized in telecom applications to generate the center wavelengths for any channel on the ITU or other optical grid.

A novel tuning mechanism is disclosed which provides for electrical or mechanical tuning to a known position or electrical parameter, e.g., voltage, current, capacitance, with the required precision in the selected center wavelength arising as a result of a novel arrangement of a grid generator and a channel selector. The grid generator exhibits first pass bands which correspond to the individual channels of a selected wavelength grid and a finesse which suppresses cavity side modes of the laser. The channel selector exhibits second pass bands differing from the first transmission bands by an amount corresponding substantially inversely with the number of channels of the selected wavelength grid. This relationship allows "vernier" tuning of the output wavelength of the laser to a selected wavelength on the wavelength grid. The finesse of the grid generator and channel selector is chosen to suppress channels adjacent to the selected channel.

In an embodiment of the a communication apparatus with a tunable filter includes a grid generator and a channel selector. The grid generator is suitable for positioning in an optical path of a beam. The grid generator of a first selected optical path length determinative of a first free spectral range substantially corresponding to a spacing between adjacent gridlines of the selected wavelength grid. The channel selector suitable for positioning in the optical path of the beam and the channel selector with a tunable second optical path length determinative of a second free spectral range differing from the first free spectral range by an amount corresponding substantially inversely with the number of channels of the selected wavelength grid and said second optical path length tunable to a selected one of the number of channels of the wavelength grid. A corresponding method is disclosed.

BRIEF DESCRIPTION OF THE DRAWINGS

These and other features and advantages of the present invention will become more apparent to those skilled in the art from the following detailed description in conjunction with the appended drawings in which:

FIGS. 2A–B are isometric and top views respectively of a tunable external cavity laser with a vernier tuned filter according to the current invention.

FIGS. 3A–B are isometric and top views respectively of alternate embodiments of the tunable filter shown in FIGS. 2A–B.

DETAILED DESCRIPTION OF THE EMBODIMENTS

The invention pertains to wavelength-agile optical filters suitable for wavelength-division-multiplexed (WDM) optical communications networks. More particularly, the invention pertains to optical filters with a wavelength reference that can be remotely switched to arbitrarily selectable channels on a standard grid, and to re-configurable optical communications networks employing same. The present invention provides a communication apparatus with a tunable filter which may be used in a wide range of applications including tuning an external cavity laser (ECL), selecting a wavelength for an add/drop multiplexer and providing channel selection and feedback for a wavelength locker. The tunable filter may thus be utilized in telecom applications to generate the center wavelengths for any channel on the ITU or other optical grid.

A novel tuning mechanism is disclosed which provides for electrical or mechanical tuning to a known position or electrical parameter, e.g., voltage, current, capacitance, with the required precision in the selected center wavelength arising as a result of a novel arrangement of a grid generator and a channel selector. The grid generator exhibits first pass bands which correspond to the individual channels of the selected wavelength grid and a finesse which suppresses side modes of the laser. The channel selector exhibits second pass bands differing from the first transmission bands by an amount corresponding substantially inversely with the number of channels of the selected wavelength grid. This relationship allows "vernier" tuning of the output wavelength of the laser to a selected wavelength on the wavelength grid. The finesses of the grid generator and channel selector are chosen to suppress lasing on channels adjacent to the selected channel. The tuning mechanism does not require a closed loop feedback system to control the channel selector.

Figure 1:
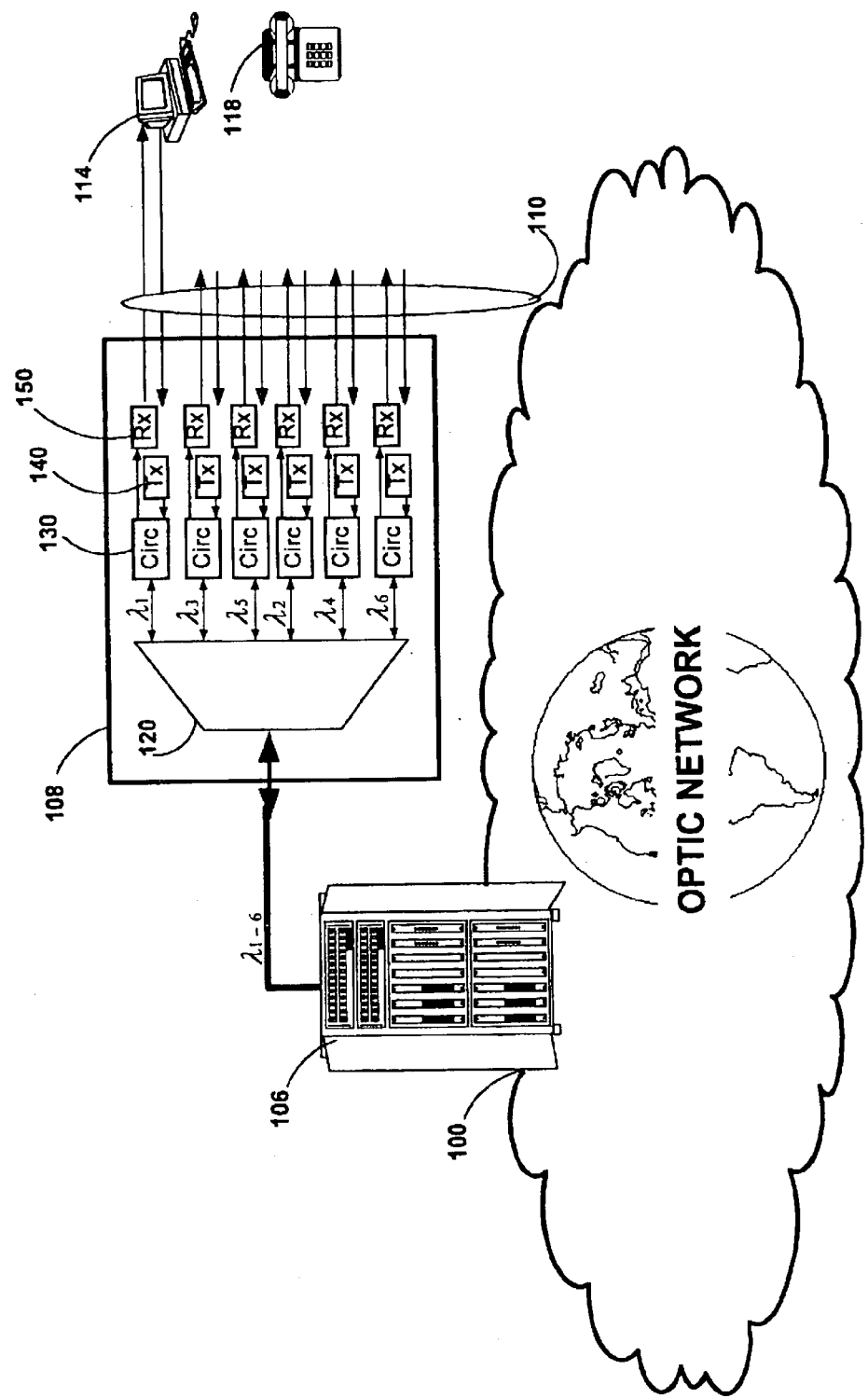
FIG. 1 shows an embodiment of the invention in which an optical network is coupled to a plurality of data and voice subscriber lines by an optical multiplexer (mux) and demultiplexer (demux) utilizing external cavity lasers tunable to the center frequency of any of the wavelength division multiplexed channels on the optical network.

FIG. 1 shows an embodiment of the invention in which an optical network is coupled to a plurality of data and voice subscriber lines by an optical mux/demux utilizing ECL's tunable by means of the tunable filter to the center frequency of any of the WDM channels on the optical network. An optical network 100, a central office or remote terminal 106, a data terminal 114 and voice terminal 118 are shown. The modulated data may be carried on a number of channels in multiple access protocols including but not limited to: wavelength division multiplexing (WDM), dense wavelength division multiplexing (DWDM), frequency division multiple access (FDMA), etc. Currently this expansion of bandwidth is being accomplished by what is known as "wavelength division multiplexing" (WDM), in which separate subscriber/data sessions may be handled concurrently on a single optic fiber by means of modulation of each of those subscriber datastreams on different portions of the light spectrum. The precise center frequencies of each channel are specified by standard setting organizations such as the International Telecommunications Union (ITU). These center frequencies are set forth as part of a wavelength grid which defines the center frequencies and spacing between channels. Typically, the grid spacing is even and occurs at integer multiples of a selected fundamental frequency.

At each node in the network, e.g., central office or remote terminal 106, optical transceivers mounted on fiber line cards, e.g., card 108, are provided. Each line card includes a multi-stage multiplexer/de-multiplexer 120, a circulator bank 130, a transmitter bank 140, and a receiver bank 150. The multiplexer/de-multiplexer is a passive optical device which divides wavelengths (or channels) from a multi-channel optical signal, or combines various wavelengths (or channels) on respective optical paths into one multi-channel optical signal depending on the propagation direction of the light.

In the receive mode, after de-multiplexing, each individual channel is passed via a corresponding circulator within circulator bank 130 to a corresponding receiver in receiver bank 150. Each receiver includes a narrow bandpass photodetector, framer and decoders. Switches (not shown) couple the receiver over the corresponding one of subscriber lines 110 to a voice or data terminal 118, 114, respectively.

In the transmit mode, each line card transmitter bank 140 includes a bank of lasers, e.g., 128 lasers radiating light at one of the selected center frequencies of each channel of the telecommunications grid. The wavelength range of current optical grids is 1525–1575 nm. Each subscriber datastream is optically modulated onto the output beam of a corresponding semiconductor laser. A framer permits framing, pointer generation and scrambling for transmission of data from the bank of 128 or more lasers and associated drivers. The modulated information from each of the semiconductor lasers is passed via a corresponding circulator into the multiplexer 120, the output of which couples with a single optic fiber for transmission. The operation of the line card in the embodiment shown is duplex, meaning that bi-directional communications are possible. Thus, the same device operates as a multiplexer and de-multiplexer.

FIGS. 2AB are isometric side and top views respectively of a tunable external cavity laser with a vernier tuned filter according to an embodiment of the current invention. The laser cavity is delimited by the partially reflecting rear facet 226 of the gain medium/laser amplifier 224 and by an external retroreflector 264. Tunable feedback to control the lasing wavelength is provided by the external cavity which is optically coupled to the anti-reflection (AR) side 228 of the gain medium. The effective reflectivity of the external cavity should be much greater than the residual reflectivity of the AR coated front facet so that the vernier tuned filter 290 can deliver sufficient feedback to put the laser in the "strong feedback" regime. The vernier tuned filter includes in this embodiment, grid generator 246 and the channel selector, e.g., interference filter/etalon 252. The external cavity laser also includes lens 242, channel tuner 254, grid control 248, base 260, output coupling optics 212, and fiber optic 206. The laser amplifier 224 in the embodiment shown is a laser diode.

Structurally, the tunable laser is shown laid out along an optical path 208. Coupling optics 212 are positioned between the back facet 226 of the laser 224 and a fiber optic 206. The laser and coupling optics are mounted to the base 260 by individual mounts 222 and 210 respectively. The fiber optic is coupled by ferrule 204 to an optical coupler 202 which is in turn coupled to base 260. The laser amplifier, in an embodiment of the invention, is a conventional Fabry-Perot laser diode. The front rear facets 228–226 of the laser diode are aligned with the longitudinal axis 208. The front facet has an AR coating with a reflectivity of less than 0.5%. The rear facet in this embodiment includes a partially reflecting dielectric coating. The proximal end of the external cavity is located at the front facet 228 of the laser diode. The distal end of the external cavity is defined by the retroreflector 264. The cavity itself extends from the rear facet of the gain medium to the retroreflector. The retro reflector 264 is coupled to base 260 via mount 262.

Within the cavity, a channel selector 252, grid generator 246, and cavity-coupling lens 242 are mounted coaxially with the optical path 208. The cavity-coupling lens is attached via mount 240 to the base 260 proximate to the front facet 228 of the gain medium 224. This lens(es) reshapes the divergent beam emitted from the gain medium for proper coupling to the external cavity. The grid generator in the embodiment shown is a temperature stabilized etalon that precisely references a selected wavelength grid by allowing feedback to the laser of pass bands centered about the wavelengths of the selected wavelength grid, on which communication channels will be established. In the embodiment shown the optical characteristics of the grid generator are temperature controlled so as to maintain alignment between the pass bands of the grid generator and a selected wavelength grid. The temperature of the grid generator may be controlled via a first thermal actuator 244 under the control of the grid controller 248. In the embodiment shown the first thermal actuator couples the grid generator to the base 260. In an alternate embodiment of the invention the first thermal actuator extends the full length of the base 260, and is used to temperature regulate all components within the cavity with the exception of the channel selector which is separately temperature regulated. The grid controller 248 contains logic for controlling, via temperature, the pass band characteristics of the grid generator. This may include closed loop feedback of temperature, wavelength etc.

The grid generator 246 operates as a filter, e.g., an interference filter with a thickness Lg and index of refraction $n_g$ chosen such that its loss spectrum comprises a multiplicity of minima within the communications band at wavelengths that coincide with the center wavelengths of the selected wavelength grid. More generally the grid generator filter function results in a plurality of passbands centered on each of the gridlines of the selected wavelength grid. (See FIGS. 4A–B and 5A–C). The grid generator has a finesse that suppresses neighboring modes of the laser between each channel. In this embodiment of the invention the grid generator is an interference element, e.g., a parallel plate solid/gas etalon. The grid generator is precisely dimensioned to have a free spectral range ($FSR_{Grid\_Gen}$) corresponding to the spacing between wavelengths/gridlines of a selected wavelength grid, e.g., an ITU grid (See FIGS. 4A–B and 5A–C). In this embodiment of the invention the grid generator is fixed to the base 260.

In alternate embodiments of the invention the grid generator or channel selector may be implemented with a diffraction element, an interference element, or a birefringent element. In still another embodiment of the invention, the gain medium itself may serve as part of the vernier tuned filter 290, as either the grid generator or the channel selector. In this embodiment both facets of the gain medium would retain some reflectivity and comprise the grid generating or channel selecting element. In general the free spectral range of the etalon thus formed would depend on temperature, diode current and photon flux. Properly controlled, the combination of optical feedback from the diode facets and that provided by the external cavity would yield the same vernier tuning behavior.

The channel selector 252 also operates as a filter, e.g., a Fabry-Perot filter, an interference filter, etc., with constructive interference, that results in a plurality of passbands differing from the first pass bands by an amount corresponding substantially inversely with the number of channels of the selected wavelength grid. This relationship allows "vernier" tuning of the output wavelength of the laser to a selected wavelength on the wavelength grid. The finesse of the grid generator and channel selector is chosen to suppress channels adjacent to the selected channel. In an alternate embodiment of the invention the second pass bands have a periodicity corresponding with the gain bandwidth of the gain medium.

In this embodiment the channel selector includes a gas or solid etalon 252. The etalon includes opposing planar first and second reflectors which are highly reflective, e.g., ($FSR_{Channel\_Selector}$) differing from that of the grid generator ($FSR_{Grid\_Gen}$) by an amount corresponding substantially inversely with the number of channels in the wavelength grid. Both free spectral ranges of the grid generator and channel selector are broader than the free spectral range of the cavity ($FSR_{Cavity}$) (See FIGS. 4A–B and FIGS. 5A–C). In an embodiment of the invention, the FSR of the channel selector differs from the FSR of the grid generator by an amount which substantially corresponds to the quotient of the channel spacing and the number of channels in the wavelength grid, e.g., an ITU grid (See FIGS. 4A–B and FIGS. 5A–C). Vernier tuning of the channel selector results in a single loss-minimum within the communications band which can be tuned across the grid. The combined feedback to the gain medium from the grid generator together with the channel selector supports lasing at the center.

Channel selection in this embodiment of the invention is brought about by changes in the optical path length 256 of the channel selector. This in turn may result from either or both a change in the index of refraction of the channel selector 252 or of its thickness along the optical path, which in this case is aligned with the "z" axis. In the embodiment shown, the second thermal actuator 250 provides a temperature sink/source to decrease/increase the temperature of the channel selector 252 under the control of the channel tuner 254. This decreases/increases the optical path length of the channel selector. The FSR of the channel selector varies during tuning, but the variation is slight, e.g., less than +/−1%. This is a result of the fact that the tuning range of the channel selector is limited to a range of one channel spacing within the wavelength grid.

The temperature control of the device may include individual temperature control of: the grid generator 246, the base 260, and the gain medium 224. The channel tuner and the grid control include logic 254L,248L, respectively, for tuning the channel selector 252 and for maintaining the reference characteristics of the grid generator 246 respectively. These modules may be implemented separately or in combination. They may be implemented with open or closed loop feedback of temperature, wavelength, position etc. A single processor with appropriate program code and lookup table(s) may be used to control both the channel tuner and grid control. In an embodiment of the invention the lookup table contains data or formula which correlate wavelength of either/both the channel selector 252 or the grid generator 246 with the control variable(s). In the above discussed embodiment the control variable is temperature. In alternate embodiments of the invention the control variable(s) include: position, rotation, temperature, electrical parameters, electro-optic parameters etc. The lookup table(s) may contain a formula or a plurality of records which correlate the pass band characteristics of either or both the channel selector and the grid generator with a specific control variable, e.g. tuning parameter, appropriate for the manner in which selector/generator is being tuned/regulated. Tuning/regulation may be accomplished by mechanical, electrical or opto-electrical tuning device. Mechanical parameters include positions of the channel selector, (See FIG. 3A). Electrical parameters include current, voltage, capacitance, and inductance. Opto-electric parameters include index of refraction and birefringence. The parameters may be input for a group of similar devices or may be individually calibrated for each device, using a wavelength meter during assembly of the device.

In an embodiment of the invention, the calibration of the ECDL may be accomplished by a processor which sweeps the channel selector through the entire tuning range pausing at increments along the tuning range to allow a wavelength meter to correlate the measured wavelength with the center wavelengths of each channel of the selected wavelength grid. As each center wavelength is detected or interpolated, the tuning parameter corresponding with that parameter is measured as well. These correlations are then written to the memory 294 as individual records or as a formula from which individual records may be calibrated. With the wavelength information thus embedded in the assembled lasers on-board memory, the tunable laser may be shipped with only the channel tuner 254 and the grid control 248 and without the wavelength meter. The absence of a closed loop control for tuning results in reduced form factor, cost and complexity in the subject instrument. In alternate embodiments of the invention either or both the channel tuner and the grid control may be equipped with sensors to form a closed loop feedback control system.

In an alternate embodiment of the invention the device may be fine tuned by logic controlling the temperature of any one or all of: the gain medium, the base, and the grid generator to maintain the accuracy of the selected center frequencies with those of the selected wavelength grid. The device may be fine-tuned by logic which senses the output of the laser and compares the output with a master reference etalon. This process generates a fine-tuning signal to the transmitter's internal temperature controller for the purpose of aligning the internal reference to the master. This process need not be conducted continuously but can be applied intermittently to correct for long term drifts due to thermistor aging or other factors.

In FIG. 2A the output beam 266 is shown passing through the partially reflective back facet of the retroreflector 264 while output beam 220 is shown passing through the partially reflective back facet 226 of the laser diode 224. In a typical device only one output beam, either 266 or 220 would be available, with the other blocked by a highly reflective coating on the corresponding one of the retroreflector or the back facet of the laser diode. The coupling of an output beam, either 266 or 220 to an optic fiber is provided by an optical coupler 202. The optical coupler may include lenses and a feedback blocker, e.g. a non-reciprocal element. In the embodiment shown the optical coupler couples to the fiber optic 206 via ferrule 204. This assembly couples the fiber optic to the output beam 220. In this embodiment the retroreflector is fully reflective and the back facet 226 of the diode 224 is partially reflective, thus providing an output beam from the back facet. In an alternate embodiment of the invention the output beam would be tapped from the back facet of the retroreflector. Tapping the output beam from the retroreflector back facet has the added benefit of providing lower source spontaneous emission since the output beam makes a complete pass through all optics in the system.

In alternate embodiments of the invention tilting of either or both the grid generator and the channel selector may be implemented to reduce spurious feedback to the gain medium. In FIG. 2B the channel selector is shown tilted 270 about the y axis so that its face is no longer normal to the optical axis, in this case the "z" axis. This reduces spurious feedback to the gain medium. In still other embodiments of the invention a one way filter system may be added to the cavity to further reduce spurious feedback to the gain medium. Such a system may employ quarter wave plates positioned on either side of the grid generator and channel selector. Since the output beam of the laser is polarized, the quarter wave plates block the return of light to the gain medium that has not made a dual pass through both the grid generator and channel selector. In either embodiment the close proximity of the components and fiber allows integration of these components into a highly-stable opto-mechanical subsystem that can be hermetically sealed and plugged into the external cavity, thus enhancing tolerance to ambient temperature, shock, and vibration.

FIGS. 3A–B are isometric and top views respectively of alternate embodiments of the tunable filter shown in FIGS. 2A–B.

In FIG. 3A an embodiment of the channel selector is shown in which a wedge shaped solid/gas etalon 312 is employed. The etalon includes opposing reflective surfaces 314–316 at an angle to one another. Tuning is brought about by moving the wedge along the y axis across the optical path. Tuning results from the variation in the thickness of the channel selector along the optical path 208 as it is moved across the beam 230. This movement is brought about by a position actuator 310. In the retracted position, the beam traverses relatively thicker portions of the etalon. In the extended position, the beam traverses a relatively thinner portion of the etalon. Thus, in the extended position of the etalon, the etalon supports shorter wavelength channels at which constructive interference takes place between the reflective surfaces of the etalon. In the retracted position, the etalon supports longer wavelength channels. The required range of motion 318 of the position actuator 310 along the "y" axis may be in the centimeter range in practice.

The channel tuner 254 provides the electrical impulse to control the expansion and contraction of the actuator 310. Suitable actuators may deliver linear or arcuate displacement and include but are not limited to: stepper motors, DC servomotors, solenoids, voice-coils, ultrasonic motors, shape-memory actuators, piezo electrics, thermal expansion mechanisms, etc. The channel selector may be implemented with other optical elements including: diffraction elements, interference elements other than gas/solid etalons, and birefringent elements. Tuning may be brought about, mechanically, electrically, and electro-optically.

In an alternate embodiment of the invention shown in FIG. 3B tuning of the channel selector 252 is brought about by rotation 354 of the channel selector about an axis normal to the beam, e.g. the y axis. In this embodiment the channel selector may be implemented with a parallel plate etalon with a rotary actuator 352 to vary the angle at which it intersects the optical path.

In still other embodiments of the invention, the channel selector may be implemented as an air gap etalon with a piezo electrically actuated gas-filled gap to vary the refractive index of the gap (Not shown). The channel selector may be implemented as a Fabry-Perot etalon with an electro-optically tunable spacer medium, such as a liquid crystal (Not shown).

The channel selector may be implemented with a diffraction element and a rotary actuator to vary the angle at which the grating intersects the optical path. Tuning is accomplished by varying the angle of incidence of the beam on the surface of the grating. The FSR of the grating is designed to differ from that of the grid generator by an amount corresponding substantially inversely with the number of channels in the wavelength grid. In an embodiment of the invention the difference corresponds substantially to the quotient of the channel spacing and the number of channels in the wavelength grid.

The channel selector may be implemented with a birefringent material, gas, liquid or crystal which provides a variable optical path length in response to a stimulus, electrical or mechanical. Examples of birefringents with electro-optic properties include Pockels and Kerr cells (Not shown).

In still another embodiment of the invention either or both the grid generator and the channel selector may be implemented with silicon. The silicon may be temperature controlled by direct current-induced heating with cooling provided by a global thermo-electric cooler. Alternately, current could be used to achieve the required index change since silicon undergoes index-of-refraction variation with current. P-N junctions may be exploited to create high-injection conditions if required.

Figure 4:
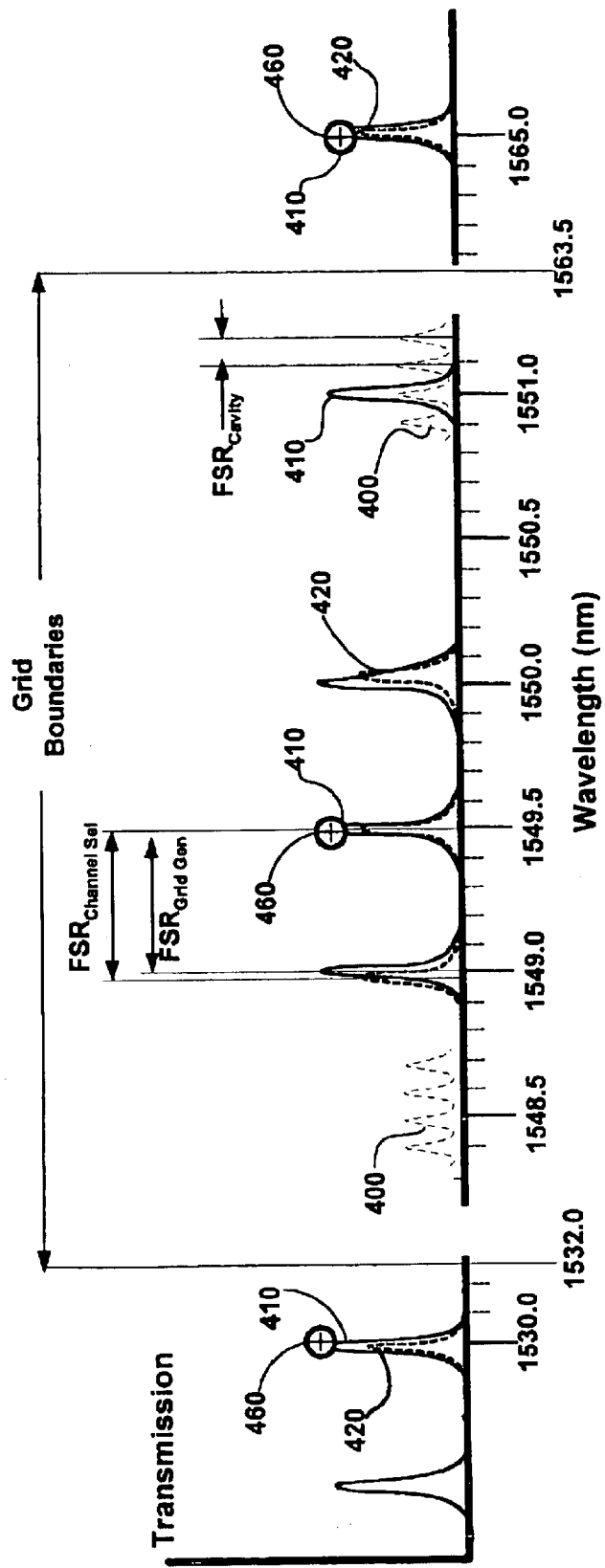
FIG. 4 is a graph showing pass bands for the laser cavity, the grid generator, and the channel selector with respect to a selected wavelength grid.

FIG. 4 is a graph of the individual filter characteristics, i.e., pass bands for the laser cavity 400, the grid generator 410, and the channel selector 420 with respect to a selected channel grid. Gain is shown on the y-axis and wavelength on the x-axis. Each may have specific periodic relationships to the other. The periodic peaks, i.e. pass bands 400 of the cavity, in an embodiment of the invention periodically align with the center wavelengths of each of the channels in the wavelength grid. In the example shown, that grid extends over 64 channels periodically spaced apart at approximately 0.5 nm or 62 GHz intervals, between the shortest wavelength channel 1532 nm to the longest wavelength channel 1563.5 nm. The periodic peaks, i.e. pass bands 410 of the grid generator, periodically align with each center wavelength of each channel in the selected wavelength grid. The channel selector exhibits substantially the same number of periodic peaks 420 within the bandwidth of the wavelength grid as does the grid generator but they differ in periodicity. More specifically, the channel selector will have one more or one fewer peaks than the grid generator within the tunable bandwidth of the wavelength grid. Thus the pass bands of the grid generator and channel selector are shown aligned at three locations 460 only one of which lies within the selected wavelength grid.

These relationships are expressed in the following Equation 1A–B.

$$FSR_{GridGen} \approx i \cdot FSR_{Cavity} \qquad \text{Equation IA}$$

$$FSR_{ChanSel} \geq \approx \frac{M}{M \pm 1} \cdot FSR_{GridGen} \qquad \text{Equation 1B}$$

where i is an integer indicating the number of laser modes between gridlines and M is the total number of channels within the selected wavelength grid. Thus the $FSR_{ChanSel}$ differs from the $FSR_{GridGen}$ by an mount substantially corresponding to $1/M * FSR_{GridGen}$. The lasing modes are governed not only by vernier tuning of the two etalons but also by the cavity round-trip phase condition Good mode performance may be achieved either by designing the cavity length as an integer sub multiple of the $FSR_{GridGen}$ as discussed above or by making the cavity length variable. This latter result may be achieved by, for example, independent temperature control of the gain medium, or end mirror or other intracavity element.

Equation II expresses the FSR of the grid generator as a function of the optical pathlength of the grid generator and the spacing between channels in the wavelength grid:

$$FSR_{GridGen} = \left(\frac{1}{2}\right)\frac{c}{n_g \cdot L_g} \approx \text{Channel\_Spacing} \qquad \text{Equation II}$$

where c is the speed of light in a vacuum, $n_g$ is the refractive index of the grid generator and $L_g$ is the length along the optical path of the grid generator. For the grid generator assuming an index of refraction of 1.0 and a channel spacing of 0.5 nm or approximately 62 GHz the thickness would be approximately equal to 2 mm.

FSR of Grid Generator and Tuner

Equation III expresses the FSR of the channel selector as a function of the optical path length of the channel selector and the bandwidth of the wavelength grid and as a function of the channel spacing and the number of channels:

$$FSR_{ChanSel} = \left(\frac{1}{2}\right)\frac{c}{n_s \cdot L_s} \approx FSR_{GridGen} \pm \frac{FSRGridGen}{M} \quad \text{Equation III}$$

where $n_s$ is the refractive index of the channel selector and $L_s$ is the length along the optical path of the channel selector and M is the number of channels. For 128 Channels at 50 GHz spacing the FSR of the grid generator would be 50 GHz, and the difference in free spectral range for the tuner would be +/−0.39 GHz, i.e. 50.39 GHz or 49.61 GHz.

Equation IV expresses the FSR of the overall cavity as a function of channel spacing:

$$FSR_{Cavity} = \left(\frac{1}{2}\right)\frac{c}{\sum n_j \cdot L_j} \approx \frac{\text{Channel\_Spacing}}{j} \quad \text{Equation IV}$$

where j is an integer series corresponding to each element, lens, gain medium, etalons, gratings, etc. and including air/gas within the combined internal and external cavities and $n_j$ is the refractive index of the $j_{th}$ element in the cavities and $L_j$ is the length along the optical path of the $j_{th}$ element in the cavity. The cavity length would be approximately 12 mm assuming an index of refraction of 1.0 and a mode spacing of ¼ the channel spacing, i.e. 12.4 GHz or about 0.1 nm.

When the grid generator and channel selector are optically coupled in an ECDL to provide feedback to the gain medium, the following relationship is attained in which the combined effect of the filters is the product of their individual transmission characteristics. The grid generator selects periodic longitudinal modes of the cavity at intervals corresponding to the channel spacing and rejects neighboring modes. The channel selector selects a channel within the wavelength grid and rejects other channels.

In an alternate embodiment of the invention M is chosen to equal a subset of the total number of channels within the selected wavelength grid. For example, if M equals half the number of wavelengths in the overall wavelength grid, then the channel selector can be used to pick out every second channel, e.g. odd or even channel without departing from the scope of the claimed invention.

Figure 5A:
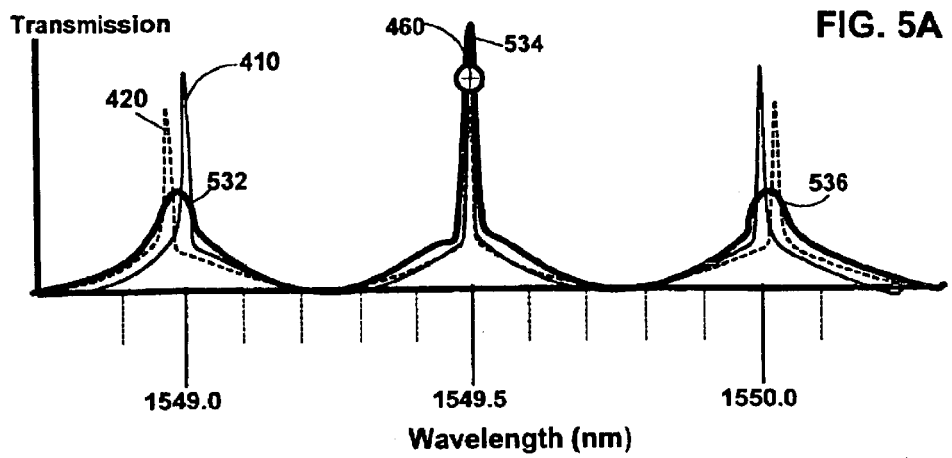
FIGS. 5A–C are graphs showing the gain for each of a plurality of channels on a WDM grid responsive to tuning of the external cavity laser.
Figure 5B:
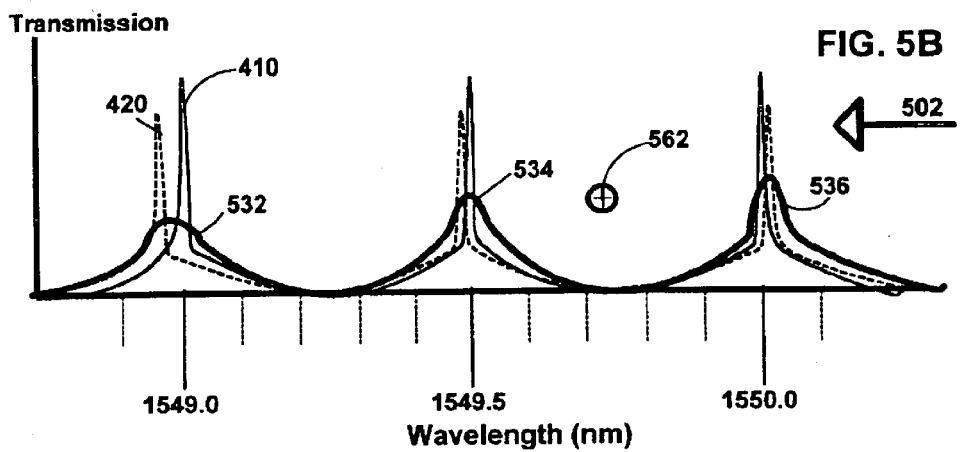
Figure 5C:
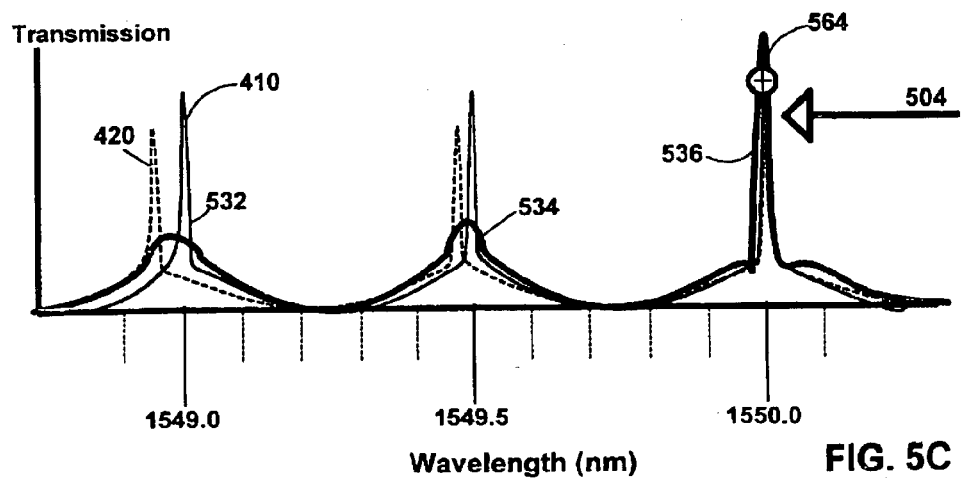

FIGS. 5A–C show graphically the tuning of the channel selector bandpass between a channel centered at 1549.5 nm and an adjacent channel at 1550 nm. The selection of a mode, i.e., channel, generated by the grid generator and the attenuation of adjacent modes/channels is also shown.

In FIG. 5A the grid generator pass bands 410 are shown tuned 460 with the channel selector pass bands 420 at 1549.5 nm. That results in a maximum combined transmission peak 534 for the grid generator and channel selector at 1549.5 nm. At the neighboring channels, i.e. 1549.0 nm and 1550.0 nm the combined transmissions 532 and 536 respectively, are severely attenuated by comparison. The amount of attenuation is a function of the finesse of the channel selector and grid generator as will be discussed below.

In FIG. 5B the pass bands of the channel selector have been shifted 502 to a shorter wavelength. The wavelength selected by this tuning 562 falls between the channel centered at 1549.5 mn and the channel at 1550.0 nm. As a result the combined transmission profiles 532–536 of the grid generator and channel selector at 1549.0 nm, 1549.5 nm and 1550.0 nm are minimized since at none of these wavelengths do any of the pass bands align.

In FIG. 5C the pass bands of the channel selector have been shifted 504 still further toward shorter wavelengths. The wavelength selected by this tuning 564 falls on the channel centered at 1550.0 nm. This results in a maximum combined transmission peak 564 for the grid generator and channel selector at 1550.0 nm. At the neighboring channels, i.e. 1549.0 nm, 1549.5 nm and 1550.5 nm (not shown) the combined transmissions 532 and 536 respectively, are severely attenuated by comparison.

Figure 6:
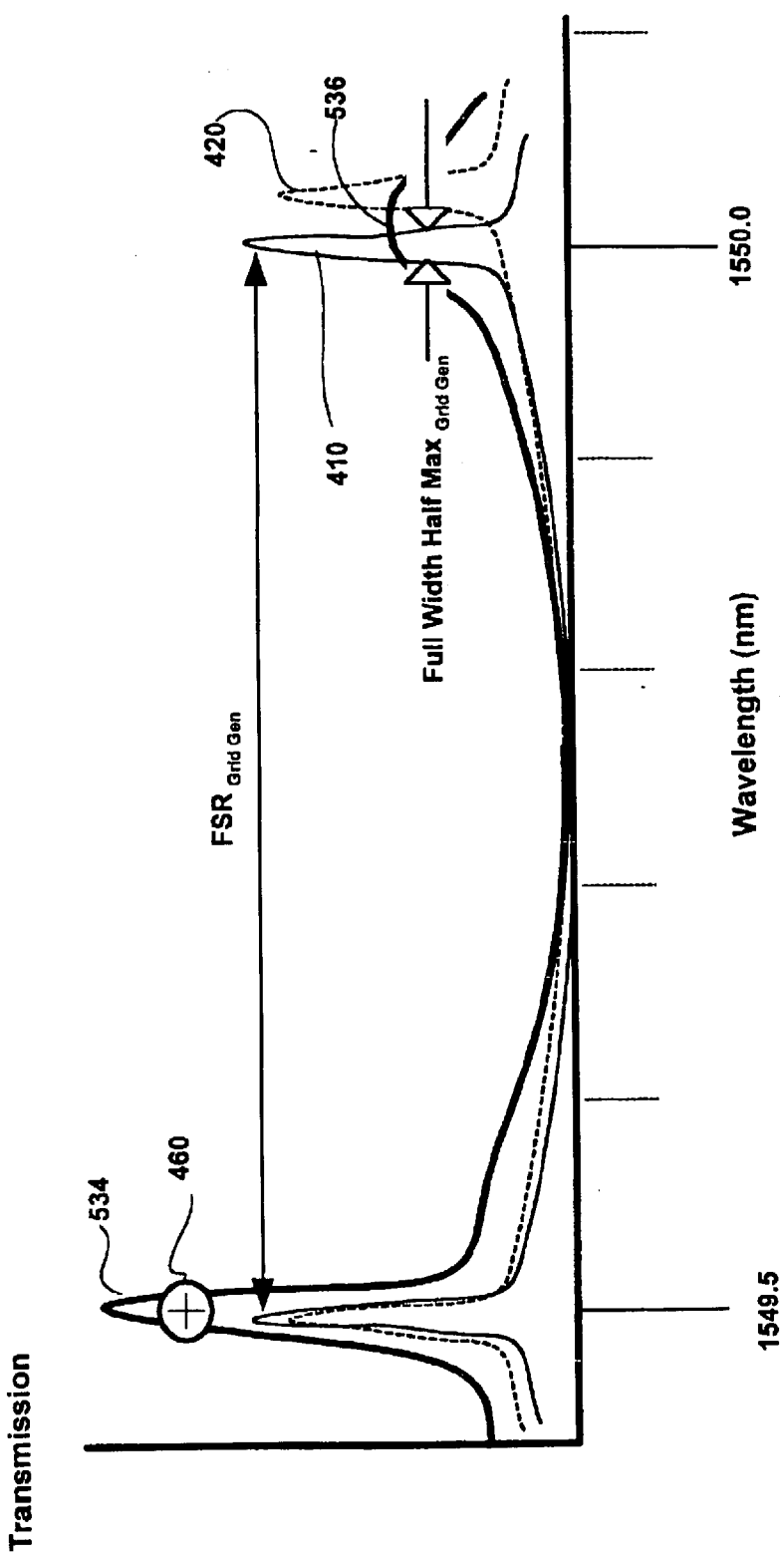
FIG. 6 is a graph of transmission vs. wavelength for the combined filter function of the grid generator and channel selector.

FIG. 6 is a graph of transmission vs. wavelength for the combined filter function of the grid generator and channel selector. As a measure of the sharpness of the filter transmission profiles, the half width of each filter, a.k.a. full-width at half maximum (FWHM), of each filter, e.g., the channel selector and the grid generator, determines the attenuation of nearest neighboring laser modes or channels. The positioning of both the grid generator and channel selector within the oscillator, i.e. the ECL cavity, further improves the spectral purity of the laser output and results in improved sidemode suppression. The free spectral range and transmission half width of the grid generator peak 410 are indicated with arrows. The half-width γ is a measure of the sharpness of the peaks, that is, how rapidly the transmission drops off on either side of a local maximum. Half-width is described as the full width at half maximum (FWHM).

Finesse

The filter half widths may be optimized for use in a given EDL by choice of surface reflectivities since Finesse, the ratio of free spectral range to half width, is related to reflectivity. Finesse is the ratio of the separation of adjacent maxima to the half-width of the peak as expressed in the following Equation Va.

$$Finesse = \frac{FSR}{\gamma} \quad \text{Equation Va}$$

Equation Vb expresses the finesse of the grid generator in terms of the number of accessible channels. The finesse of the channel selector may differ slightly without significant effect.

$$Finesse = \frac{FSR_{GridGen}}{Fwhm} \approx k \cdot M \quad \text{Equation Vb}$$

where k is an extinction coefficient representing the degree of extinction between a transmission maximum at the selected channel and the transmission at its nearest neighbor and M is the number of channels in the selected wavelength grid. When extinction of 50% is required for neighboring channels, the coefficient k has the value 0.8. Thus in an embodiment of the invention finesse is substantially equal to the number of channels in the selected wavelength grid. Single mode laser performance with substantial side-mode suppression due to the regenerative behavior of the cavity may be obtained with even less extinction, which will in practice allow good laser performance for smaller values of k, or for lower finesse grid and selector filters. In these latter embodiments of the invention it is possible that finesse may be relaxed to ½ or ⅓ the number of channels in the wavelength grid when the side-mode suppression of the cavity is considered.

The following two paragraphs describe the derivation of the factor k used in Equation V. A simple figure-of-merit can be derived relating the required etalon Finesse to the channel spacing and number of required channels. For two etalons with Gaussian transmission peaks, the peak combined transmission is $\exp(-\Delta\omega^2/\omega_0^2)$ where $\Delta\omega$ is the separation between the individual transmission peaks and $\omega_0$ is the $1/e^2$ half-width of the individual transmission peaks. Assuming that the required suppression of transmission to guarantee single-mode lasing is 0.5, we find that $\Delta\omega=\text{sqrt}(\ln(2))*\omega_0$ which approximately equals $0.8*\omega_0$. That is k=0.8.

The maximum tuning range is established by the frequency difference between the nearest two overlapping transmission peaks. The smaller the frequency offset, the greater the distance to the next overlapping peak. In other words, the ballpark figure for tuning range is the etalon Finesse times the channel spacing. The laser can address a number of channels approximated by its Finesse, regardless of the channel spacing. Since 50 GHz is approximately 0.4 nm near 1.5 urn wavelengths, an etalon Finesse of 200 gives 200 addressable 50 GHz channels, or a tuning range of 80 nm. Allowing for the possibility of smaller k values, one sees that practical finesse values of 100 or less can be used to address many channels.

EXAMPLE

From a default configuration, where the laser frequency is selected at the wavelength of overlap between the two etalons, the laser can be tuned. As the temperature of the second etalon is changed, it's free-spectral range will change. Given enough change in $FSR_2$, the overlap wavelength will "snap" by $FSR_1$, and a new laser frequency will be selected. One can select $FSR_1$=50 GHz, for example, which corresponds to approximately 2 mm of BK7 glass.

The following example shows how to determine the required optical path length change (e.g. a combination of thermal expansion and temperature dependent index change) to achieve a single channel snap. Assuming a channel spacing of 50 GHz and that the grid generator is 1.999 mm of BK7, with a $FSR_{GridGen}$=50 GHz. If the Finesse is 200, the transmission $1/e^2$ half-width is $\omega_0$=FSR/F=0.25 GHz, and for simplicity, we can choose $FSR_{ChannelSel}$=50.25 GHz. The thickness of the channel selector etalon is therefore 1.989 mm. The wavelengths of interest where these two etalon transmission peaks overlap is 1.492 um. This is the $4019^{th}$ order of $FSR_1$ and the $3999^{th}$ order of $FSR_{ChannelSel}$.

If this laser is to be tuned by one channel, it will operate on the $4020^{th}$ order of $FSR_{GridGen}$, and the $4000^{th}$ order of the adjusted $FSR_{ChannelSel}'$. The new wavelength will follow the relation $(N_1+1)*FSR_{GridGen}=(N_2+1)*FSR_{ChannelSel}'$ where $N_1*FSR_{GridGen}=N_2*FSR_{ChannelSel}$. This can be used to determine how much change is required by relating $FSR_{ChannelSel}$ to $FSR_{ChannelSel}'$. Thus, for the example given, $FSR_{ChannelSel}'/FSR_{ChannelSel}=1+1.2*10^{-6}$ or a difference of 0.00012%.

This $10^{-6}$ change in optical path length in BK7 from a nominal 2 mm*1.5 requires only about a 0.053K temperature change. The coefficient of thermal expansion is $\alpha=7.1*10^{-6}$, and the coefficient of index of refraction change is $8.7*10^{-7}$ at 1.5 um. So a change in d(nL)/dT= L*dn/dT+n*dL/dT=L*(dn/dT+n*$\alpha$). Substituting, we find d(nL)/dT=2.3*$10^{-5}$ mm/K, which is enough to reach the path length change specified above with a 0.053 K temperature change. Interestingly, for BK7, the primary change is due to the physical length change of the glass, not the index of refraction.

Figure 7:
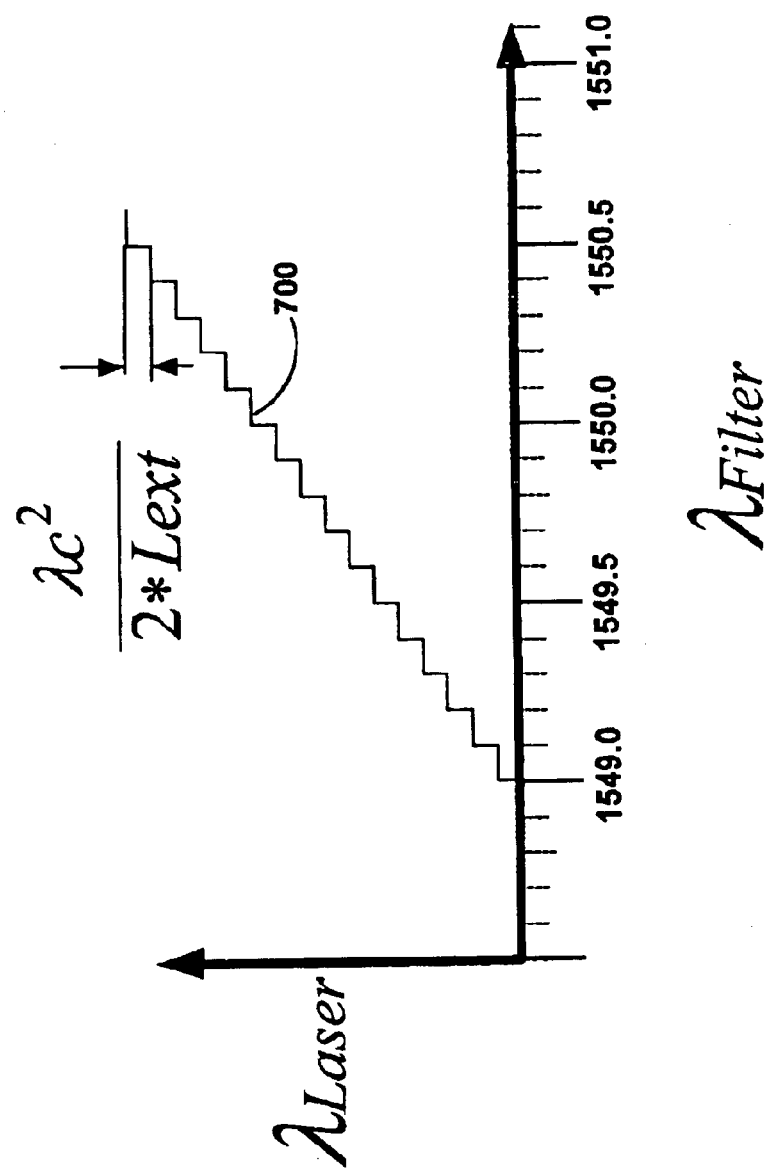
FIG. 7 is a graph which shows the discreet tuning of the external cavity laser brought about by the tunable filter shown in the accompanying FIGS. 2–3.

FIG. 7 is a graph which shows the tuning characteristic of the external cavity laser brought about by the tunable filter discussed above. External cavity lasers for test and measurement applications typically are designed to have a loss minimum that varies continuously with respect to the tuning control variable, resulting in a linear tuning characteristic that provides complete, continuous wavelength coverage over a specified range. In contrast, the laser of the present invention is designed to have a distinctly discontinuous, discrete, staircase-tuning characteristic.

The graph shows lasing wavelength versus the selected center wavelengths of the wavelength grid. In an embodiment of the invention, the optical path length of the cavity, including optical elements as well as the air or gas which fills the void between elements, is designed so that selected modes of the cavity align with the center frequency of the channels of the wavelength grid. The characteristic has a staircase shape 700 that is highly desirable. Due to this shape, the position tolerance of the channel selector is greatly relaxed, so that the selector can be controlled in an open-loop manner using a lookup table. This provides the obvious benefit of making closed-loop feedback control unnecessary. The wavelengths of the longitudinal modes of the laser cavity are related to the cavity length by $$L_{ext} \approx m \cdot \frac{\lambda_m}{2}$$

where m is an integer referred to as the mode number. Typically $m>10^3$. The laser may only oscillate at wavelengths that are longitudinal modes. The mode spacing is approximately $$\frac{\lambda_c^2}{2L_{ext}}$$

where $\lambda_c$ is the center of the tuning range. Therefore, if the cavity length remains constant as the filter/etalon peak is tuned, the laser output will change discontinuously, giving rise to a tuning characteristic known as mode-hop tuning.

Figure 8:
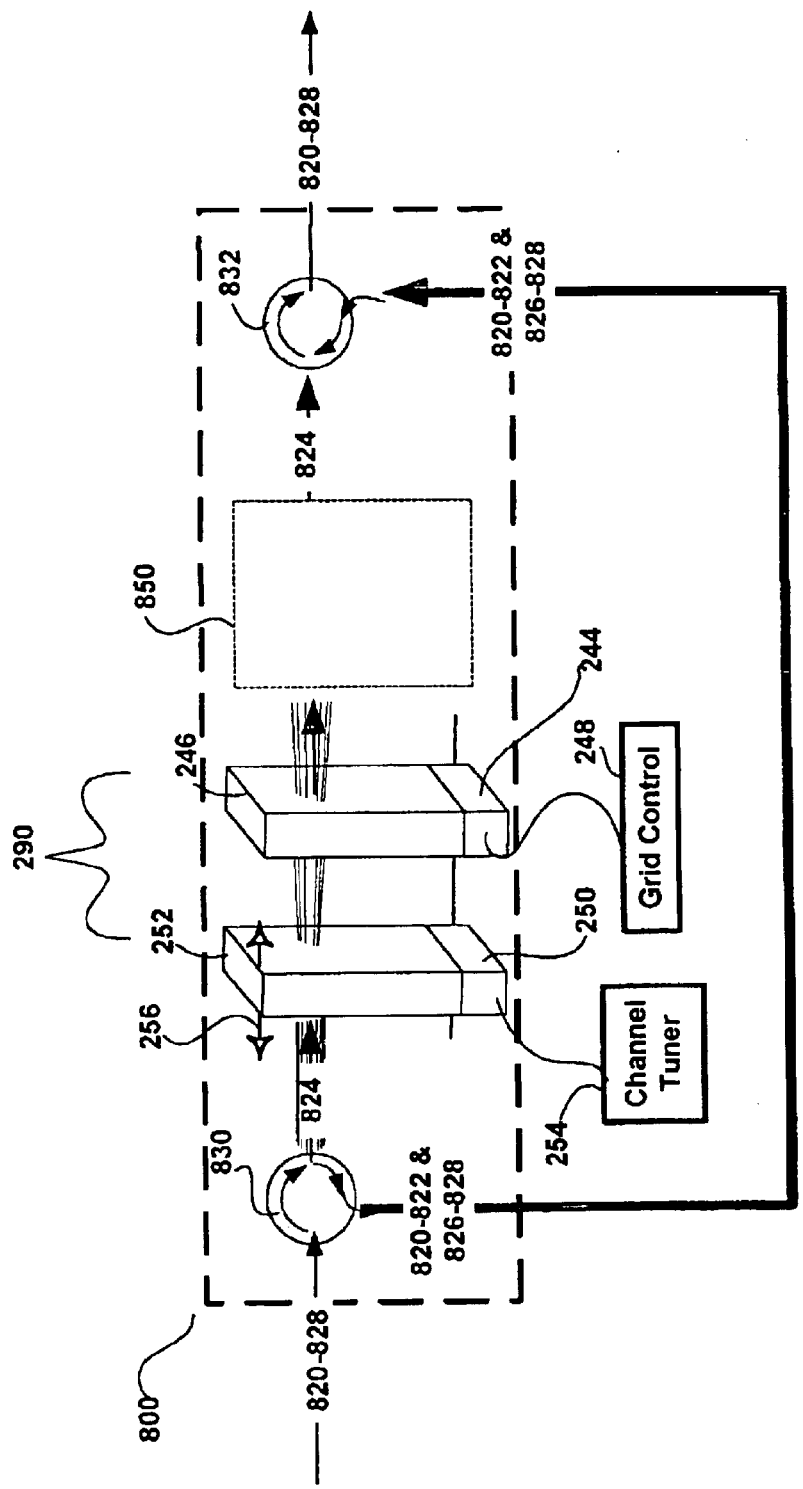
FIG. 8 shows the tunable filter of the current invention utilized as an add/drop multiplexer

FIG. 8 shows the vernier tuned filter of the current invention utilized as an add/drop multiplexer sandwiched between two circulators 830, 832. The circulator has the property that the propagation direction of light determines the port at which light will be available. The vernier tuned filter has the property of reflecting all of the WDM channels except the channel(s) selected by the filter. The channels reflected by the filter propagate along a return path counter to the original propagation direction.

In operation, a plurality of WDM channels 820–828 is introduced into circulator 830. At circulator 830, light reflected from the vernier tuned filter 290 which corresponds in wavelength with, for example, channels 120–122 and 126–128, passes out a port of circulator 830 and is returned to circulator 832. The channel selected by the vernier tuned filter, i.e. channel 124, passes through the filter substantially unimpeded and enters the optional processing block 850. That block represents any of a number of optical, opto-electric, and electrical functions that can be performed on a "dropped channel". These include: amplification, modulation, demodulation, etc.

At the second circulator 832 the outgoing communication from process block 850 is added to the optical communication stream with the result that the outgoing data stream includes channels 820–828. In this simple fashion, a number of users can communicate across an all-optical network or a channel can be conditioned by amplification, dispersion compensation, etc. The vernier tuned filter is ideal for such applications since it can be fabricated in a highly wavelength selective manner.

Figure 9:
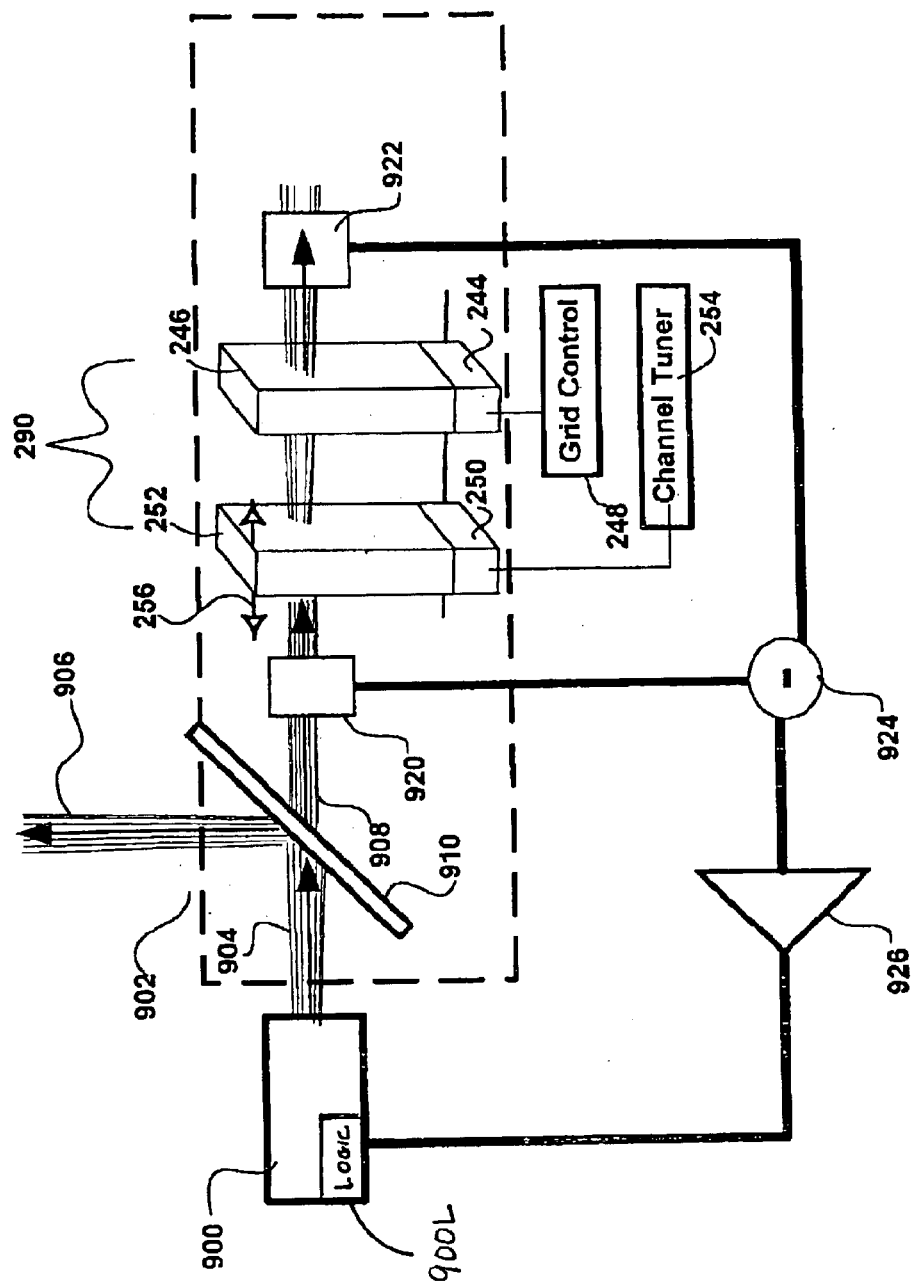
FIG. 9 is a block diagram of an alternate embodiment of the tunable filter as part of a wavelength locker.

FIG. 9 is a block diagram of an alternate embodiment of the vernier tuned filter as part of a wavelength locker. A optical beam source 900 is shown emitting an output beam 904. That beam may include a number of channels each centered on a corresponding gridline of a selected wavelength grid. That beam passes through a beam splitter 910 to generate an output beam 906 and a reference beam 908. The reference beam passes through a first photodetector 920 and a second photodetector 922. Between the first and second photodetectors is positioned the vernier tuned filter generally 290. That filter is tuned in the above discussed manner to a selected wavelength at which to measure one or more of the input wavelengths of the beam. The drift of the output wavelength of the laser is measured at the second photodetector. Differencer 924 accepts as inputs the signal provided by the photodetectors 920–922. The photodetectors in combination with the differencer comprise an error detector to detect a difference in energy levels of the beam at the input and output of the vernier tuned filter and to provide an output in the form of an error signal. The error signal, may be subject to amplification in amplifier 926 and is supplied to the laser 900 and to logic 900L therein for adjusting a wavelength control parameter of the laser, e.g. drive current. In an embodiment of the invention, where the control parameter is current, the output of the amplifier maybe coupled to logic which includes a summer which sums the error signal and a laser drive signal to drive the laser.

The foregoing description of a preferred embodiment of the invention has been presented for purposes of illustration and description. It is not intended to be exhaustive or to limit the invention to the precise forms disclosed. Obviously many modifications and variations will be apparent to practitioners skilled in this art. It is intended that the scope of the invention be defined by the following claims and their equivalents.

What is claimed is:

1. A tunable filter for use in optical communication apparatus, said tunable filter being tunable to each selected center wavelength of a number of channels, and each of the channels centered on a corresponding gridline of a selected wavelength grid; said tunable filter comprising:

a grid generator having reflective surfaces, mounted for optical alignment in an optical path of a beam, and the grid generator of a first selected optical path length determinative of a first free spectral range having a first plurality of transmission peaks corresponding to gridlines of the selected wavelength grid;

a channel selector having reflected surfaces, mounted for optical alignment in the optical path of the beam, and the channel selector with a tunable second optical path length determinative of a second free spectral range having a second plurality of transmission peaks within the selected wavelength grid, wherein the second free spectral range (FSR2) is related to the first free spectral range (FSR1) by the equation:

$$FSR2 \approx (M/M\pm 1)(FSR1)$$

wherein M is the total number of channels within the selected wavelength grid;

means for maintaining the first optical path length of the grid generator; and means for varying the tunable second optical path length of the channel selector to tune the optical beam to a selected channel of the wavelength grid and substantially attenuate the other channels of the wavelength grid.

2. The tunable filter of claim 1, wherein the second free spectral range of said channel selector differs from the first free spectral range by an amount substantially corresponding with the quotient of the first free spectral range and the number of channels of the selected wavelength grid.

3. The tunable filter of claim 1, wherein a finesse of said channel selector substantially corresponds with less than the number of channels of the selected wavelength grid.

4. The tunable filter of claim 1, wherein said grid generator further comprises at least one of a Fabry-Perot filter and an interference element.

5. The tunable filter of claim 1, wherein said grid generator further comprises an etalon.

6. The tunable filter of claim 1, wherein said grid generator further comprises an Etalon; and wherein said means for maintaining the first optical path length of the grid generator comprises a thermal controller to control a temperature of said Etalon.

7. The tunable filter of claim 1, wherein said means for varying the tunable second optical path length of the channel selector comprises a mechanical actuator to tune said channel selector by varying the tunable second optical path length of said channel selector.

8. The tunable filter of claim 1, wherein said means for varying the tunable second optical path length of the channel selector comprises a thermal actuator to tune said channel selector by varying a temperature of the channel selector.

9. The tunable filter of claim 1, wherein said means for varying the tunable second optical path length of the channel selector comprises an electro-optic actuator to tune said channel selector by varying the tunable second optical path length of said channel selector.

10. The tunable filter of claim 1, wherein the channel selector includes at least one of selected length and a tunable index of refraction.

11. The tunable filter of claim 1, wherein the channel selector includes a tunable length and a selected index of refraction.

12. The tunable filter of claim 1, wherein said channel selector comprises:

a gas spaced etalon tunable by means of tuning a pressure of a gas within the gap to vary the second optical path length.

13. The tunable filter of claim 1, wherein said channel selector comprises:

an etalon electrically tunable in response to an applied electric field to vary the second optical path length.

14. The tunable filter of claim 1, wherein the channel selector further comprises:

an etalon thermally tunable in response to an applied thermal energy to vary the second optical path length.

15. The tunable filter of claim 1, wherein said channel selector further comprises:

a semiconductor element with a tunable index of refraction responsive to an applied electric field to vary the second optical path length.

16. The tunable filter of claim 1, wherein said channel selector further comprises a grating; and wherein said means for varying the tunable second optical path length of the channel selector comprises an actuator for varying an angle of said grating with respect to an optical path of the beam to tune the beam to a selected one of the plurality of channels of the wavelength grid.

17. The tunable filter of claim 1, further comprising:

a logic to tune said channel selector to the selected one of the number of channels of the wavelength grid.

18. The tunable filter of claim 1, further comprising:
a logic to tune said grid generator to the selected wavelength grid.

19. In the communication apparatus of claim 1, a further improvement of:
a gain medium to emit a beam, and said gain medium capable of accepting feedback to tune the gain medium to a selected one of the number of channels of the wavelength grid.

20. The communication apparatus of claim 1, further comprising:
a first optical circulator with at least a first port, a second port and a third port and a beam entering the first port exiting the second port, and the beam entering the second port exiting the third port;
a second optical circulator with at least the first port, the second port and the third port and the beam entering the first port exiting the second port, and the beam entering the second port exiting the third port; and
said tunable filter optically coupled to the second port of said first optical circulator and the first port of said second optical circulator to tune a selected one of the number of channels of the wavelength grid to pass between the second port of said first optical circulator and the first port of said second optical circulator.

21. The communication apparatus of claim 1, further comprising:
a gain medium tunable to emit a beam at a selected wavelength;
said tunable filter with an input an output, and said tunable filter input positioned in an optical path of the beam to provide at said output a filter of said beam at a selected one of the number of channels of wavelength grid;
an error detector to detect a difference in energy levels of said beam at said input and said output of said tunable filter; and
logic for providing a closed loop feedback of the difference to tune said gain medium to the selected one of the number of channels.

22. The communication apparatus of claim 1, and said grid generator comprising:
a gain medium to emit a beam, and the gain medium including a front facet and a rear facet and the first selected optical path length between the front facet and the rear facet determinative of the first free spectral range and corresponding to the spacing between adjacent gridlines of the selected wavelength grid.

23. The communication apparatus of claim 1, and said channel selector comprising:
a gain medium to emit a beam and the gain medium including a front facet and a rear facet and the tunable second selected optical path length between the front facet and the rear facet determinative of the second free spectral range, a difference between the first free spectral range and the second free spectral range being inversely proportional to the number of channels of the selected wavelength grid, and said second optical path length tunable to a selected one of the number of channels of the wavelength grid.

24. The tunable filter of claim 1, wherein said channel selector further comprises at least one of: a diffraction element, an interference element, and a birefringent element.

25. The tunable filter of claim 24, wherein the birefringent element includes at least one of: a Pockels cell and a Kerr cell.

26. The tunable filter of claim 24, wherein the interference element comprises:
a wedge-shaped etalon.

27. The tunable filter of claim 26, wherein the interference element comprises at least one of a wedge-shaped solid etalon and a wedge-shaped air gap etalon.

28. The tunable filter of claim 26, wherein said means for varying the tunable second optical path length comprises an actuator for translating said wedge-shaped etalon across the optical path of the beam to tune the second optical path length.

29. A method for filtering an optical beam to a corresponding center wavelength for each of a number of channels of a selected wavelength grid, comprising:
generating a first set of wavelengths corresponding to a first plurality of transmission peaks within the optical beam having a first free spectral range corresponding to the center wavelengths of each of the channels of the selected wavelength grid;
generating a variable second set of wavelengths corresponding to a second plurality of transmission peaks within the optical beam having a second free spectral range, wherein the second free spectral range (FSR2) is related to the first free spectral range (FSR1) by the equation:

$$FSR2 \approx (M/M \pm 1)(FSR1)$$

wherein M is the total number of channels within the selected wavelength grid; and
varying the second set of wavelengths such that the optical beam is substantially attenuated at all center wavelengths of each of the channels of the selected wavelength grid except a desired channel.

30. The method of claim 29, wherein the step of generating the first set of wavelengths comprises aligning a grid generator having an optical path length determinative of the first free spectral range with the optical beam.

31. The method of claim 29, wherein the step of generating the variable second set of wavelengths comprises the step of aligning a channel selector having a variable optical path length determinative of the second free spectral range with the optical beam.

32. The method of claim 29, wherein the step of varying the variable second set of wavelengths comprises the step of varying the optical path length of the channel selector.

* * * * *

UNITED STATES PATENT AND TRADEMARK OFFICE
CERTIFICATE OF CORRECTION

PATENT NO. : 6,888,856 B2
DATED : May 3, 2005
INVENTOR(S) : Green et al.

It is certified that error appears in the above-identified patent and that said Letters Patent is hereby corrected as shown below:

<u>Column 15, line 38 - Column 18, line 56,</u>
Delete claims and insert the following:

1. An optical communication apparatus including a tunable filter, the tunable filter being tunable to each selected center wavelength of a number of channels, and each of the channels centered on a corresponding gridline of a selected wavelength grid, the tunable filter comprising:

a grid generator having reflective surfaces, mounted for optical alignment in an optical path of a beam, wherein the grid generator including a first selected optical path length determinative of a first free spectral range having a first plurality of transmission peaks corresponding to gridlines of the selected wavelength grid;

a channel selector having reflected surfaces, mounted for optical alignment in the optical path of the beam, wherein the channel selector including a tunable second optical path length determinative of a second free spectral range having a second plurality of transmission peaks within the selected wavelength grid, wherein the second free spectral range (FSR2) is related to the first free spectral range (FSR1) by the equation:

$FSR2 = (M / M \pm 1)(FSR1)$ wherein M is the total number of channels within the selected wavelength grid;

means for maintaining the first selected optical path length of the grid generator; and means for varying the tunable second optical path length of the channel selector to tune the optical beam to a selected channel of the wavelength grid and substantially attenuate the other channels of the wavelength grid.

2. The optical communication apparatus of Claim 1, wherein a finesse of the channel selector substantially corresponds with less than the number of channels of the selected wavelength grid.

3. The optical communication apparatus of Claim 1, wherein the grid generator comprises at least one of a Fabry-Perot filter and an interference element.

UNITED STATES PATENT AND TRADEMARK OFFICE
CERTIFICATE OF CORRECTION

PATENT NO. : 6,888,856 B2
DATED : May 3, 2005
INVENTOR(S) : Green et al.

Page 2 of 8

It is certified that error appears in the above-identified patent and that said Letters Patent is hereby corrected as shown below:

<u>Column 15, line 38 - Column 18, line 56 (cont'd),</u>

4. The optical communication apparatus of Claim 1, wherein the grid generator comprises an etalon.

5. The optical communication apparatus of Claim 1, wherein the grid generator comprises an etalon; and wherein the means for maintaining the first optical path length of the grid generator comprises a thermal controller to control a temperature of the etalon.

6. The optical communication apparatus of Claim 1, wherein the channel selector comprises at least one of: a diffraction element, an interference element, and a birefringent element.

7. The optical communication apparatus of Claim 1, wherein the means for varying the tunable second optical path length of the channel selector comprises a mechanical actuator to tune the channel selector by varying the tunable second optical path length of the channel selector.

8. The optical communication apparatus of Claim 1, wherein the means for varying the tunable second optical path length of the channel selector comprises a thermal actuator to tune the channel selector by varying a temperature of the channel selector.

9. The optical communication apparatus of Claim 1, wherein the means for varying the tunable second optical path length of the channel selector comprises an electro-optic actuator to tune the channel selector by varying the tunable second optical path length of the channel selector.

10. The optical communication apparatus of Claim 1, wherein the channel selector includes at least one of selected length and a tunable index of refraction.

11. The optical communication apparatus of Claim 1, wherein the channel selector includes a tunable length and a selected index of refraction.

12. The optical communication apparatus of Claim 1, wherein the channel selector comprises:

UNITED STATES PATENT AND TRADEMARK OFFICE
CERTIFICATE OF CORRECTION

PATENT NO. : 6,888,856 B2
DATED : May 3, 2005
INVENTOR(S) : Green et al.

It is certified that error appears in the above-identified patent and that said Letters Patent is hereby corrected as shown below:

Column 15, line 38 - Column 18, line 56 (cont'd), a gas spaced etalon including a gap to hold a gas, the gas spaced etalon tunable by adjusting a pressure of the gas within the gap to vary the second optical path length.

13. The optical communication apparatus of Claim 1, wherein the channel selector comprises:
    an etalon electrically tunable in response to an applied electric field to vary the second optical path length.

14. The optical communication apparatus of Claim 1, wherein the channel selector further comprises:
    an etalon thermally tunable in response to an applied thermal energy to vary the second optical path length.

15. The optical communication apparatus of Claim 1, wherein the channel selector comprises:
    a semiconductor element with a tunable index of refraction responsive to an applied electric field to vary the second optical path length.

16. The optical communication apparatus of Claim 7, wherein the birefringent element includes at least one of: a Pockels cell and a Kerr cell.

17. The optical communication apparatus of Claim 7, wherein the interference element comprises:
    a wedge-shaped etalon.

18. The optical communication apparatus of Claim 18, wherein the interference element comprises at least one of a wedge-shaped solid etalon and a wedge-shaped air gap etalon.

19. The optical communication apparatus of Claim 18, wherein the means for varying the tunable second optical path length comprises an actuator for translating the wedge-shaped etalon across the optical path of the beam to tune the second optical path length.

UNITED STATES PATENT AND TRADEMARK OFFICE
CERTIFICATE OF CORRECTION

PATENT NO. : 6,888,856 B2
DATED : May 3, 2005
INVENTOR(S) : Green et al.

It is certified that error appears in the above-identified patent and that said Letters Patent is hereby corrected as shown below:

Column 15, line 38 - Column 18, line 56 (cont'd),

20. The optical communication apparatus of Claim 1, wherein the channel selector comprises a grating; and wherein the means for varying the tunable second optical path length of the channel selector comprises an actuator for varying an angle of the grating with respect to the optical path of the beam to tune the beam to the selected channel of the wavelength grid.

21. The optical communication apparatus of Claim 1, further comprising:
    a logic to tune the channel selector to the selected channel of the wavelength grid.

22. The optical communication apparatus of Claim 1, further comprising:
    a logic to tune the grid generator to the selected wavelength grid.

23. The optical communication apparatus of Claim 1, further comprising:
    a gain medium to emit the beam, and the gain medium capable of accepting feedback to tune the gain medium to a selected one of the number of channels of the wavelength grid.

24. The optical communication apparatus of claim 1, further comprising:
    a first optical circulator including a first port, a second port, and a third port; and
    a second optical circulator including a first port, a second port, and a third port,
    wherein the tunable filter optically coupled between the second port of the first optical circulator and the first port of the second optical circulator, the tunable filter to tune a selected one of the number of channels of the wavelength grid to pass between the second port of the first optical circulator and the first port of the second optical circulator.

25. The optical communication apparatus of Claim 1, further comprising:
    a gain medium tunable to emit the beam at a selected wavelength;
    the tunable filter including an input and an output, the tunable filter input positioned in the optical path of the beam
    an error detector to detect a difference in energy levels of the beam at the input and the output of the tunable filter and to generate an error signal based on the difference; and

UNITED STATES PATENT AND TRADEMARK OFFICE
CERTIFICATE OF CORRECTION

PATENT NO. : 6,888,856 B2
DATED : May 3, 2005
INVENTOR(S) : Green et al.

It is certified that error appears in the above-identified patent and that said Letters Patent is hereby corrected as shown below:

Column 15, line 38 - Column 18, line 56 (cont'd),

26. The optical communication apparatus of Claim 1, wherein the grid generator comprising:
   a gain medium to emit the beam, the gain medium including a front facet and a rear facet, wherein the first selected optical path length between the front facet and the rear facet determinative of the first free spectral range and corresponding to the spacing between adjacent gridlines of the selected wavelength grid.

27. The optical communication apparatus of Claim 1, wherein the channel selector comprising:
   a gain medium to emit the beam, the gain medium including a front facet and a rear facet, wherein the tunable second selected optical path length between the front facet and the rear facet determinative of the second free spectral range.

Claims 29-32 (Cancelled)

28. A method to filter an optical beam, comprising:
   generating a first set of wavelengths corresponding to a first plurality of transmission peaks within the optical beam, the first set of wavelengths having a first free spectral range corresponding to the center wavelengths of each of the channels of the selected wavelength grid;
   generating a variable second set of wavelengths corresponding to a second plurality of transmission peaks within the optical beam, the variable second set of wavelengths having a second free spectral range, wherein the second free spectral range (FSR2) is related to the first free spectral range (FSR1) by the equation:
   $FSR2 = (M / M \pm 1)(FSR1)$
   wherein M is the total number of channels within the selected wavelength grid;
   generating a tuning signal at a channel tuner; and
   varying the variable second set of wavelengths based on the tuning signal to select a desired channel of the channels of the selected wavelength grid.

UNITED STATES PATENT AND TRADEMARK OFFICE
CERTIFICATE OF CORRECTION

PATENT NO.    : 6,888,856 B2
DATED         : May 3, 2005
INVENTOR(S)   : Green et al.

It is certified that error appears in the above-identified patent and that said Letters Patent is hereby corrected as shown below:

Column 15, line 38 - Column 18, line 56 (cont'd),

29. The method of Claim 33, wherein generating the first set of wavelengths comprises aligning a grid generator having an optical path length determinative of the first free spectral range with the optical beam.

30. The method of Claim 33, wherein generating the variable second set of wavelengths comprises aligning a channel selector having a variable optical path length determinative of the second free spectral range with the optical beam.

31. The method of Claim 35, wherein varying the variable second set of wavelengths comprises varying the optical path length of the channel selector.

32. An apparatus, comprising:
 a grid generator in an optical path of an optical beam, wherein the grid generator including a first selected optical path length determinative of a first free spectral range having a first plurality of transmission peaks corresponding to gridlines of a selected wavelength grid;
 a channel selector in the optical path of the optical beam, wherein the channel selector including a tunable second optical path length determinative of a second free spectral range having a second plurality of transmission peaks within the selected wavelength grid, wherein the second free spectral range (FSR2) is related to the first free spectral range (FSR1) by the equation:

$FSR2 \approx (M / M \pm 1)(FSR1)$ wherein M is the total number of channels within the selected wavelength grid;
 a grid controller operatively coupled to the grid generator to tune the grid generator to the selected wavelength grid by adjusting the first selected optical path length of the grid generator; and
 a channel tuner operatively coupled to the channel selector to tune the channel selector to a selected channel of the channels of the wavelength grid by adjusting the tunable second optical path length of the channel selector.

UNITED STATES PATENT AND TRADEMARK OFFICE
CERTIFICATE OF CORRECTION

| | | |
|---|---|---|
| PATENT NO. | : 6,888,856 B2 | Page 7 of 8 |
| DATED | : May 3, 2005 | |
| INVENTOR(S) | : Green et al. | |

It is certified that error appears in the above-identified patent and that said Letters Patent is hereby corrected as shown below:

Column 15, line 38 - Column 18, line 56 (cont'd),

33. The apparatus of claim 37, further comprising:
    a gain medium including a front facet and a rear facet, the optical beam to be emitted from the front facet;
    a reflector positioned in the optical path of the optical beam, the grid generator and the channel selector positioned between the gain medium and the reflector, a laser cavity defined by the rear facet and the reflector; and
    an output assembly including coupling optics, the output assembly optically coupled to the rear facet of the gain medium.

34. The apparatus of claim 37, further comprising a thermal actuator thermally coupled to the grid generator to adjust the first selected optical path length of the grid generator, the thermal actuator operatively coupled to the grid controller.

35. The apparatus of claim 37, further comprising a thermal actuator thermally coupled to the channel selector to adjust the tunable second optical path length of the channel selector, the thermal actuator operatively coupled to the channel tuner.

36. The apparatus of claim 37, further comprising an electro-optic actuator coupled to the channel selector to adjust the tunable second optical path length of the channel selector, the electro-optic actuator operatively coupled to the channel tuner.

37. The apparatus of claim 37, further comprising an actuator coupled to the channel selector to move the channel selector to adjust the tunable second optical path length of the channel selector, the actuator operatively coupled to the channel tuner.

38. The apparatus of claim 37, further comprising:
    a first optical circulator including a first port, a second port, and a third port; and
    a second optical circulator including a first port, a second port, and a third port,

UNITED STATES PATENT AND TRADEMARK OFFICE
CERTIFICATE OF CORRECTION

PATENT NO.   : 6,888,856 B2
DATED        : May 3, 2005
INVENTOR(S)  : Green et al.

It is certified that error appears in the above-identified patent and that said Letters Patent is hereby corrected as shown below:

<u>Column 15, line 38 - Column 18, line 56 (cont'd),</u> wherein the grid generator and the channel selector optically coupled between the second port of the first optical circulator and the first port of the second optical circulator, the third port of the first optical circulator optically coupled to the third port of the second optical circulator, wherein the optical beam to enter the first port of the first optical circulator and to exit the second port of the second optical circulator.

39. The apparatus of claim 37, further comprising:

an error detector including a first photodetector positioned in the optical beam before the grid generator and a second photodetector positioned in the optical beam after the channel selector, wherein the error detector to generate an error signal based on a difference in energy levels of the optical beam detected at the first photodetector and the second photodetector.

40. The optical communication apparatus of claim 25 wherein the third port of the first optical circulator optically coupled to the third port of the second optical circulator,
wherein non-selected channels of the wavelength grid to exit the third port of the first optical circulator and to enter the third port of the second optical circulator.

Signed and Sealed this

Seventh Day of February, 2006

JON W. DUDAS
*Director of the United States Patent and Trademark Office*